US010950717B2

United States Patent
Tamura et al.

(10) Patent No.: US 10,950,717 B2
(45) Date of Patent: Mar. 16, 2021

(54) SEMICONDUCTOR DEVICE HAVING SEMICONDUCTOR REGIONS WITH AN IMPURITY CONCENTRATION DISTRIBUTION WHICH DECREASES FROM A RESPECTIVE PEAK TOWARD DIFFERENT SEMICONDUCTOR LAYERS

(71) Applicant: FUJI ELECTRIC CO., LTD., Kawasaki (JP)

(72) Inventors: Masaki Tamura, Shiojiri (JP); Hitoshi Abe, Matsumoto (JP); Takeshi Fujii, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 29 days.

(21) Appl. No.: 16/171,644

(22) Filed: Oct. 26, 2018

(65) Prior Publication Data

US 2019/0067462 A1 Feb. 28, 2019

Related U.S. Application Data

(63) Continuation of application No. PCT/JP2017/041002, filed on Nov. 14, 2017.

(30) Foreign Application Priority Data

Nov. 16, 2016 (JP) .............................. JP2016-223541

(51) Int. Cl.
*H01L 29/739* (2006.01)
*H01L 29/10* (2006.01)
(Continued)

(52) U.S. Cl.
CPC ........ *H01L 29/7397* (2013.01); *H01L 21/263* (2013.01); *H01L 27/0716* (2013.01);
(Continued)

(58) Field of Classification Search
CPC ............. H01L 29/7397; H01L 29/0603; H01L 29/0804; H01L 29/0834; H01L 29/41708;
(Continued)

(56) References Cited

U.S. PATENT DOCUMENTS

2008/0315364 A1 12/2008 Nemoto
2010/0308446 A1* 12/2010 Nakamura .......... H01L 29/8618
257/655
(Continued)

FOREIGN PATENT DOCUMENTS

CN 101908558 A 12/2010
CN 103999225 A 8/2014
(Continued)

OTHER PUBLICATIONS

International Search Report dated Jan. 23, 2018 in corresponding International Patent Application No. PCT/JP2017/041002.
(Continued)

*Primary Examiner* — Tucker J Wright

(57) ABSTRACT

In a surface layer of a rear surface of the semiconductor substrate, an $n^+$-type cathode region and a p-type cathode region are each selectively provided. The $n^+$-type cathode region and the p-type cathode region constitute a cathode layer and are adjacent to each other along a direction parallel to the rear surface of the semiconductor substrate. The $n^+$-type cathode region and the p-type cathode region are in contact with a cathode electrode. In an $n^-$-type drift layer, plural n-type FS layers are provided at differing depths deeper from the rear surface of the semiconductor substrate than is the cathode layer. With such configuration, in a diode, a tradeoff relationship of forward voltage reduction and reverse recovery loss reduction may be improved and soft recovery may be realized.

18 Claims, 22 Drawing Sheets

(51) Int. Cl.
*H01L 29/08* (2006.01)
*H01L 27/07* (2006.01)
*H01L 29/417* (2006.01)
*H01L 29/861* (2006.01)
*H01L 21/263* (2006.01)
*H01L 29/868* (2006.01)
*H01L 29/66* (2006.01)
*H01L 29/36* (2006.01)
*H01L 29/32* (2006.01)
*H01L 29/06* (2006.01)
*H01L 29/16* (2006.01)
*H01L 29/20* (2006.01)
*H01L 29/24* (2006.01)

(52) U.S. Cl.
CPC ...... *H01L 27/0727* (2013.01); *H01L 29/0603* (2013.01); *H01L 29/0804* (2013.01); *H01L 29/0834* (2013.01); *H01L 29/1095* (2013.01); *H01L 29/32* (2013.01); *H01L 29/36* (2013.01); *H01L 29/41708* (2013.01); *H01L 29/66136* (2013.01); *H01L 29/739* (2013.01); *H01L 29/861* (2013.01); *H01L 29/868* (2013.01); *H01L 29/8611* (2013.01); *H01L 29/8613* (2013.01); *H01L 29/1602* (2013.01); *H01L 29/1608* (2013.01); *H01L 29/2003* (2013.01); *H01L 29/24* (2013.01)

(58) Field of Classification Search
CPC ............. H01L 29/66136; H01L 29/861; H01L 29/8613; H01L 29/868; H01L 2924/12031
See application file for complete search history.

(56) References Cited

U.S. PATENT DOCUMENTS

| | | | |
|---|---|---|---|
| 2014/0246750 A1* | 9/2014 | Takishita | H01L 21/263 257/493 |
| 2014/0291723 A1 | 10/2014 | Miyazaki et al. | |
| 2015/0061090 A1 | 3/2015 | Oyama | |
| 2015/0311279 A1* | 10/2015 | Onozawa | H01L 29/868 257/139 |

FOREIGN PATENT DOCUMENTS

| | | |
|---|---|---|
| JP | 2010283132 A | 12/2010 |
| JP | 2012119716 A | 6/2012 |
| JP | 5741712 B2 | 9/2014 |
| JP | 5741712 B2 | 7/2015 |
| JP | 2015201476 A | 11/2015 |
| WO | 2007055352 A1 | 5/2007 |
| WO | 2013108911 A1 | 7/2013 |
| WO | 2013168367 A1 | 11/2013 |

OTHER PUBLICATIONS

Written Opinion of the International Searching Authority dated Jan. 23, 2018 in corresponding International Patent Application No. PCT/JP2017/041002.

Chinese Office Action dated Dec. 23, 2020, in corresponding Chinese Patent Application No. 201780027131.0.

* cited by examiner

SEMICONDUCTOR DEVICE HAVING SEMICONDUCTOR REGIONS WITH AN IMPURITY CONCENTRATION DISTRIBUTION WHICH DECREASES FROM A RESPECTIVE PEAK TOWARD DIFFERENT SEMICONDUCTOR LAYERS

CROSS REFERENCE TO RELATED APPLICATIONS

This is a continuation application of International Application PCT/JP2017/041002 filed on Nov. 14, 2017 which claims priority from a Japanese Patent Application No. 2016-223541 filed on Nov. 16, 2016, the contents of which are incorporated herein by reference.

BACKGROUND

1. Field

Embodiments of the invention relate to a semiconductor device.

2. Description of Related Art

A diode having a structure depicted in FIG. 17 is commonly known as a diode for automotive applications such as 4-wheel drive (4WD). FIG. 17 is a cross-sectional view of a structure of a conventional diode. As depicted in FIG. 17, in a diode of a conventional structure, a cathode layer 106 is constituted by an $n^+$-type region (hereinafter, $n^+$-type cathode region) 104 and a p-type region (hereinafter, p-type cathode region) 105 disposed adjacently to each other along a direction parallel to a rear surface of a semiconductor substrate 110.

Further, the diode of the conventional structure includes an n-type buffer layer 107 between an $n^-$-type drift layer 101 and the cathode layer 106. The n-type buffer layer 107 is formed to have an impurity concentration of about $1.7 \times 10^{12}/\text{cm}^3$ by ion implantation using phosphorus (P) as a dopant and acceleration energy of about 620 keV from a rear surface 110a of the semiconductor substrate 110. In FIG. 17, the n-type buffer layer (hereinafter, P-n-type buffer layer) 107 is depicted as a P-n buffer.

In this manner, the P-n-type buffer layer 107 is formed by ion implantation of phosphorus from the rear surface 110a of the semiconductor substrate 110 and therefore, is disposed at a sufficiently shallow depth from the rear surface 110a of the semiconductor substrate 110. Therefore, in a diode that includes the P-n-type buffer layer 107, the sweep of minority carriers at the time of reverse recovery is fast and the reverse recovery period is shortened, whereby power loss (hereinafter, reverse recovery loss) Err that occurs during the reverse recovery period is reduced. The rear surface 110a of the semiconductor substrate 110 is an exposed surface of the cathode layer 106 and a surface in contact with a cathode electrode 108. Reference numerals 102, 103 are a p-type anode layer and an anode electrode, respectively.

With the diode of the conventional structure, during reverse recovery, holes from the cathode electrode 108 are injected in the p-type cathode region 105. Therefore, compared to an ordinary diode having a cathode layer constituted by the $n^+$-type cathode region alone, the hole density (minority carrier density) on the cathode side increases. As a result, electric field on the cathode side is mitigated and oscillation of voltage/current waveforms during reverse recovery is suppressed. As a diode of such a conventional structure, a device has been proposed that optimizes an impurity concentration of an n-type FS layer and improves a tradeoff relationship of reducing forward voltage (forward voltage decreases) Vf and reducing reverse recovery loss Err (for example, refer to Japanese Laid-Open Patent Publication No. 2010-283132).

In Japanese Laid-Open Patent Publication No. 2010-283132, a peak value (maximum value: peak concentration) of an impurity concentration of the n-type buffer layer is in a range from $1 \times 10^{16}/\text{cm}^3$ to $1 \times 10^{20}/\text{cm}^3$, is higher than a peak value of an impurity concentration of the $n^-$-type drift layer and is lower than a peak value of an impurity concentration of the $n^+$-type cathode region. A ratio of the peak value of the impurity concentration of the n-type buffer layer to a peak value of an impurity concentration of the p-type cathode region is in a range from 0.001 to 0.1. In particular, when the impurity concentration of a part of the n-type buffer layer sandwiched between the $n^+$-type cathode region and the $n^-$-type drift layer is higher than the impurity concentration of a part sandwiched between the p-type cathode region and the $n^-$-type drift layer, the tradeoff relationship of reducing forward voltage Vf and reducing the reverse recovery loss Err is further improved.

Further, as a method of forming an n-type field stop (FS) layer, a method has been proposed of forming an n-type FS layer of a resistance lower than that of an n-type semiconductor substrate by repeatedly performing proton implantation for plural sessions at different acceleration energies from a rear surface of a semiconductor substrate constituting an $n^-$-type drift layer (for example, refer to Japanese Patent No. 5741712). In Japanese Patent No. 5741712, when the plural proton implantations are performed, a subsequent proton implantation is performed so as to compensate decreases in mobility due to remaining disorder at the previous proton implantation. As a result, disorder is reduced, an occurrence of poor characteristics is suppressed, and an n-type FS layer having a high-concentration hydrogen-related donor layer is formed.

As a diode having an n-type FS layer, a device has been proposed having an impurity concentration distribution in which in the n-type FS layer, a majority carrier concentration at the time of thermal equilibrium monotonically decreases in a thickness direction from a rear surface side toward a surface side of the semiconductor substrate and at a bottom (low impurity concentration side), curves convexly (for example, refer to Japanese Laid-Open Patent Publication No. 2015-201476 (paragraphs 0029, 0030, 0043, 0082, FIGS. 4, 5)). In Japanese Laid-Open Patent Publication No. 2015-201476, carrier lifetime of the semiconductor substrate overall is shortened, a switching speed is increased, and the n-type FS layer is provided, whereby high breakdown voltage and mitigation of rapid current changes are both achieved.

SUMMARY

According to an embodiment of the present invention, a semiconductor device includes a first semiconductor layer of a first conductivity type and having a first main surface and a second main surface; a second semiconductor layer of a second conductivity type provided on the first main surface of the first semiconductor layer; a third semiconductor layer provided on the second main surface of the first semiconductor layer; a plurality of first semiconductor regions of the first conductivity type and provided at differing depths in the first semiconductor layer, the plurality of first semiconductor regions having an impurity concentration higher than that of the first semiconductor layer; a second semiconductor region of the first conductivity type, constituting a part of the third semiconductor layer in contact with a first semiconductor region that of the plurality of first semiconductor regions is nearest the third semiconductor layer, the second semiconductor region having an impurity concentration that is higher than that of the plurality of first semiconductor regions; a third semiconductor region of the second conductivity type and constituting a part of the third semiconductor layer in contact with the first semiconductor region, the third semiconductor region being in contact with the second semiconductor region along a direction parallel to the second main surface; a first electrode in contact with the second semiconductor layer; and a second electrode in contact with the second semiconductor region and the third semiconductor region. A first maximum value of the impurity concentration of the plurality of first semiconductor regions is lower than a second maximum value of the impurity concentration of the second semiconductor region and a third maximum value of an impurity concentration of the third semiconductor region, the first maximum value being a peak, the plurality of first semiconductor regions having an impurity concentration distribution that decreases from the peak toward the second semiconductor layer and toward the third semiconductor layer. The impurity concentration of the third semiconductor region at an interface with the first semiconductor region is lower than the impurity concentration of the second semiconductor region at an interface with the first semiconductor region.

In the embodiment, the third maximum value of the impurity concentration of the third semiconductor region is lower than the second maximum value of the impurity concentration of the second semiconductor region.

In the embodiment, the third maximum value of the impurity concentration of the third semiconductor region is higher than the peak of the impurity concentration of the first semiconductor region of the plurality of first semiconductor regions.

In the embodiment, the third maximum value of the impurity concentration of the third semiconductor region is higher than a lowest value of the impurity concentration of the second semiconductor region at an interface of the second semiconductor region and the first semiconductor region of the plurality of first semiconductor regions.

In the embodiment, a part among parts of the first semiconductor region closer toward the third semiconductor layer than is the peak has an impurity concentration that is 0.5 times the first maximum value or less reaches a predetermined depth from an interface of the third semiconductor region and the first semiconductor region. A distance from the predetermined depth to the interface of the third semiconductor region and the first semiconductor region is longer than a thickness of the third semiconductor region.

In the embodiment, the distance from the predetermined depth to the interface of the third semiconductor region and the first semiconductor region is at least two times the thickness of the third semiconductor region.

In the embodiment, the distance from the predetermined depth to the interface of the third semiconductor region and the first semiconductor region is at least the thickness of the third semiconductor region and 10 µm at most.

In the embodiment, a thickness of the third semiconductor region is thinner than a thickness of the second semiconductor region.

In the embodiment, crystal defects are introduced between the third semiconductor layer and the peak of the first semiconductor region.

In the embodiment, the semiconductor device further includes a fourth semiconductor layer of the second conductivity type provided on the first main surface of the first semiconductor layer and electrically connected with the first electrode; a fourth semiconductor region of the first conductivity type electively provided in the fourth semiconductor layer and electrically connected with the first electrode; a gate insulating film in contact with a region of the fourth semiconductor layer between the fourth semiconductor region and the first semiconductor layer; a gate electrode provided opposing the fourth semiconductor layer, across the gate insulating film; and a fifth semiconductor region of the second conductivity type selectively provided in the second main surface of the first semiconductor layer to be in contact with the second electrode, the fifth semiconductor region being in contact with the second semiconductor region along a direction parallel to the second main surface.

In the embodiment, crystal defects are introduced near a boundary of the first semiconductor layer with the second semiconductor layer.

In the embodiment, the first semiconductor region is a hydrogen donor layer.

In the embodiment, peak concentrations of the impurity concentration at a part of the first semiconductor region opposing the second semiconductor region in a depth direction and at a part of the first semiconductor region opposing the third semiconductor region are equal.

According to another embodiment of the present invention, a semiconductor device includes a first semiconductor layer of a first conductivity type and having a first main surface and a second main surface; a second semiconductor layer of a second conductivity type provided on the first main surface of the first semiconductor layer; a third semiconductor layer provided on the second main surface of the first semiconductor layer; a first semiconductor region of the first conductivity type selectively provided in the first semiconductor layer, the first semiconductor region having an impurity concentration that is higher than that of the first semiconductor layer; a second semiconductor region of the first conductivity type, constituting a part of the third semiconductor layer in contact with the first semiconductor region, the second semiconductor region having an impurity concentration that is higher than that of the first semiconductor region; a third semiconductor region of the second conductivity type and constituting a part of the third semiconductor layer in contact with the first semiconductor region, the third semiconductor region being in contact with the second semiconductor region along a direction parallel to the second main surface; a first electrode in contact with the second semiconductor layer; and a second electrode in contact with the second semiconductor region and the third semiconductor region. The first semiconductor region has an impurity concentration distribution constituted by an upper convex part where the impurity concentration at a boundary with the third semiconductor layer is a peak concentration and the impurity concentration decreases linearly toward the second semiconductor layer, and a convex-shaped part formed continuously with the upper convex part on a side of the upper convex part facing toward the second semiconductor layer, the impurity concentration in the convex-shaped part decreasing with increasing depth toward the second semiconductor layer, in a curved convex shape on a low concentration side. A peak concentration of the impurity concentration of the first semiconductor region at an interface with the third semiconductor region is lower than the peak concentration of the first semiconductor region at an interface with the second semiconductor region.

In the embodiment, a length over which the convex-shaped part is distributed is longer than a length over which the upper convex part is distributed.

In the embodiment, the peak concentration of the impurity concentration of the first semiconductor region is lower than a peak concentration of the impurity concentration of the second semiconductor region.

In the embodiment, spanning the third semiconductor layer and the first semiconductor region, a hydrogen concentration at the second main surface of the first semiconductor layer is a peak concentration and has a hydrogen concentration distribution in which the hydrogen concentration decreases with proximity to the first main surface. Recombination centers are distributed from the second main surface of the first semiconductor layer to a depth deeper toward the first main surface than is the hydrogen concentration distribution.

In the embodiment, a recombination center concentration at the second main surface of the first semiconductor layer is lower than a recombination center concentration at a depth where the impurity concentration of the first semiconductor region becomes the peak concentration.

In the embodiment, the semiconductor device further includes a fourth semiconductor region of the first conductivity type provided in the first semiconductor layer, closer toward the first main surface than is the first semiconductor region and separated from the first semiconductor region, the fourth semiconductor region having an impurity concentration higher than that of the first semiconductor layer.

In the embodiment, a peak concentration of the impurity concentration of the fourth semiconductor region is lower than the peak concentration of the impurity concentration of the first semiconductor region.

In the embodiment, a recombination center concentration of the fourth semiconductor region is higher than a recombination center concentration at a depth where the impurity concentration of the first semiconductor region coincides with the impurity concentration of the first semiconductor layer.

In the embodiment, the first semiconductor region is a hydrogen donor layer.

Objects, features, and advantages of the present invention are specifically set forth in or will become apparent from the following detailed description of the invention when read in conjunction with the accompanying drawings.

DESCRIPTION OF EMBODIMENTS

Figure 1:
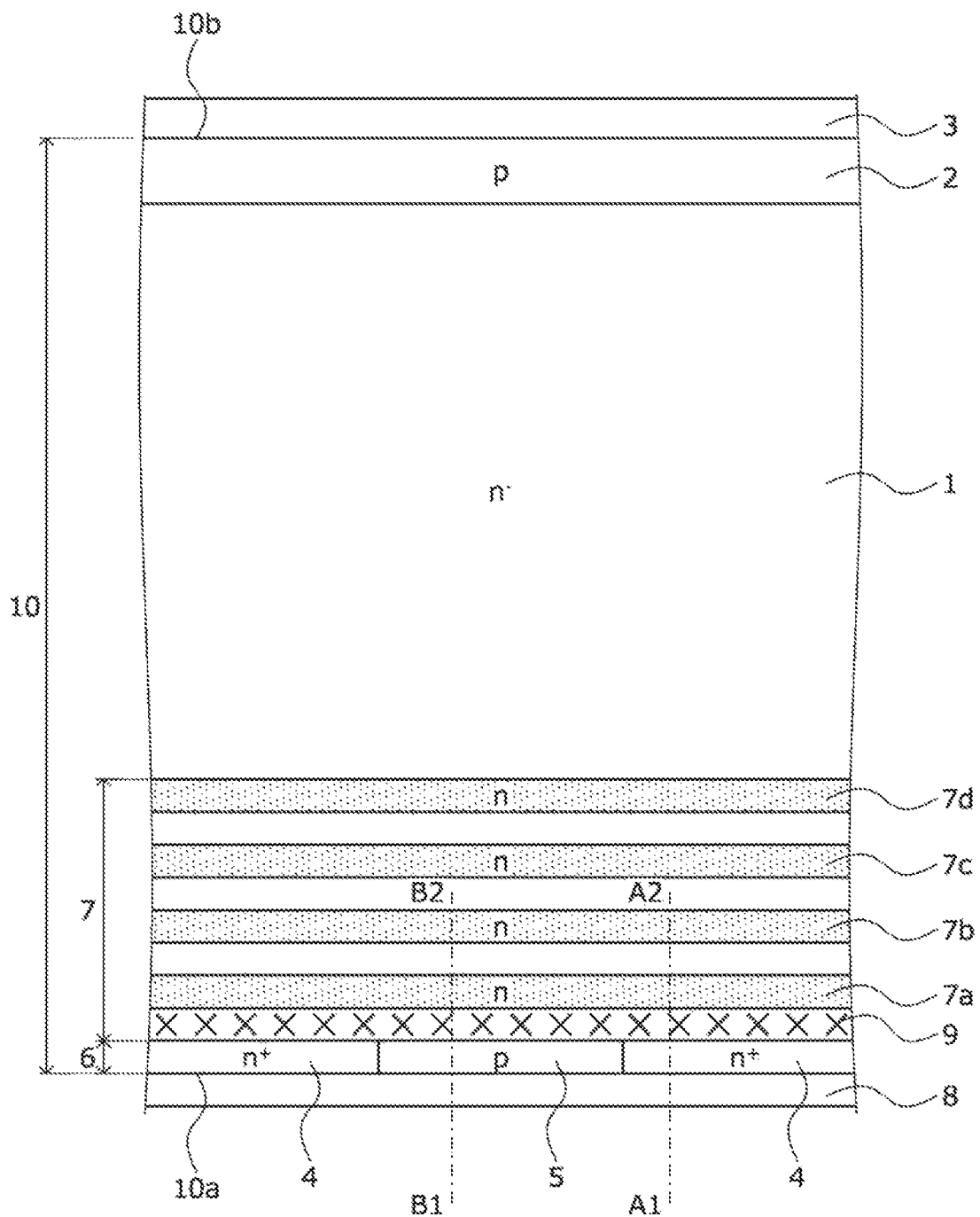
FIG. 1 is a cross-sectional view of a semiconductor device according to a first embodiment.

First, problems associated with the conventional structure will be discussed. With the diode of the conventional structure, while the reverse recovery loss Err may be reduced, the sweeping of the minority carriers becomes faster, whereby the forward voltage Vf increases. Therefore, achieving both reduction of the forward voltage Vf and reduction of the reverse recovery loss Err is difficult. Further, since the sweep of minority carriers at the time of reverse recovery becomes faster, voltage/current waveforms demonstrate hard recovery (steep reverse recovery characteristics) and oscillate, possibly leading to diode destruction.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, unless particularly stated, an impurity concentration is a donor concentration, an acceptor concentration, or a net doping concentration of these.

A structure of the semiconductor device according to a first embodiment will be described taking a diode as an example. FIG. 1 is a cross-sectional view of the semiconductor device according to the first embodiment. The semiconductor device according to the first embodiment depicted in FIG. 1 is a diode that includes an n-type field stop layer (plural n-type FS layers (first semiconductor region) 7) having plural peaks of impurity concentration in a depth direction in an n$^-$-type drift layer (first semiconductor layer) 1. The depth direction is a direction from a rear surface (second main surface) 10a toward a front surface (first main surface) 10b of a semiconductor substrate (semiconductor chip) 10 of an n$^-$type.

In particular, in a surface layer at the front surface 10b of the semiconductor substrate 10, a p-type anode layer (second semiconductor layer) 2 is provided. The p-type anode layer 2 is a diffusion region formed by ion implantation of a p-type impurity such as, for example, boron (B). On the front surface 10b of the semiconductor substrate 10, an anode electrode (first electrode) 3 is provided. The anode electrode 3 is in contact with the p-type anode layer 2. In a surface layer at the rear surface 10a of the semiconductor substrate 10, an n$^+$-type region (n$^+$-type cathode region: second semiconductor region) 4 and a p-type region (p-type cathode region: third semiconductor region) 5 are selectively provided adjacent to each other along a direction parallel to the rear surface 10a of the semiconductor substrate 10.

The n$^+$-type cathode region 4 and the p-type cathode region 5, for example, are disposed alternating along a direction parallel to the rear surface 10a of the semiconductor substrate 10. The n$^+$-type cathode region 4 is, for example, a diffusion region formed by ion implantation of an n-type impurity such as phosphorus (P). The p-type cathode region 5 is, for example, is a diffusion region formed by ion implantation of a p-type impurity such as boron. The n$^+$-type cathode region 4 and the p-type cathode region 5 constitute a cathode layer (third semiconductor layer) 6. Detailed configuration of the n$^+$-type cathode region 4 and the p-type cathode region 5 will be described hereinafter.

A part of the semiconductor substrate 10 excluding the p-type anode layer 2, the n$^+$-type cathode region 4 and the p-type cathode region 5 is the type drift layer 1. In the n$^-$-type drift layer 1, at a position deeper from the rear surface 10a of the semiconductor substrate 10 than is the cathode layer 6, the n-type FS layer 7 are provided. The n-type FS layers 7 are disposed at differing depths from the rear surface 10a of the semiconductor substrate 10 and oppose each other in the depth direction. The n-type FS layers 7 have a function of preventing a depletion layer that spreads from a pn junction between the p-type anode layer 2 and the n$^-$-type drift layer 1 at the time of reverse recovery, from reaching the n$^+$-type cathode region 4.

In particular, the n-type FS layers 7 are hydrogen donor layers that include hydrogen atoms formed by ionizing (converting to donors) hydrogen atoms introduced into the semiconductor substrate 10 by proton (H$^+$) implantation. The n-type FS layers 7 show a peak value (maximum value (first maximum value): peak concentration) of the impurity concentration at depth position of a range Rp of the proton implantation, the peak value being higher than the impurity concentration of the semiconductor substrate 10. Peaks of the impurity concentrations of the n-type FS layers 7 are at depth positions (hereinafter, peak positions) separated from each other, i.e., other n-type FS layers 7. A peak position $X_{P1}$ of a peak $P_1$ of the impurity concentration of the n-type FS layer 7 (7a) nearest the cathode is a position deeper from the rear surface 10a of the semiconductor substrate 10 than is the cathode layer 6 (refer to FIG. 2).

In FIG. 1, the four n-type FS layers 7 are disposed and are assigned reference characters 7a to 7d sequentially from the rear surface 10a side of the semiconductor substrate 10. The n-type FS layers 7 a to 7d indicate by hatching, a part at which the impurity concentration is at least half of the maximum concentration and a width of straggling (variation (variance) of the range Rp due to stochastic processes such as energy loss at the time of proton implantation) ΔRp of the range Rp centered around the range Rp of the proton implantation. Parts sandwiched by the hatched parts of the n-type FS layer 7a to 7d and a part sandwiched by the hatched part of the n-type FS layer 7a and the cathode layer 6 are, for example, a part in which disorder is reduced like in Japanese Patent No. 5741712.

On the rear surface 10a of the semiconductor substrate 10, a cathode electrode (second electrode) 8 is disposed. The cathode electrode 8 is in contact with the n$^+$-type cathode region 4 and the p-type cathode region 5. Crystal defects may be introduced into the n$^-$-type drift layer 1 and the carrier lifetime of the part in which the crystal defects may be shortened. For example, crystal defects may be introduced into the semiconductor substrate 10 overall by electron beam irradiation, or helium (He) irradiation at part (in the n-type FS layer 7a) of the n$^-$-type drift layer 1 toward the cathode layer, crystal defects 9 (indicated by x in FIG. 1) may be introduced. In FIG. 1, for example, a case is depicted in which the crystal defects 9 are introduced in a part sandwiched by the peak $P_1$ (refer to FIG. 2) of the impurity concentration of the n-type FS layer 7a and the cathode layer 6.

Figure 2:
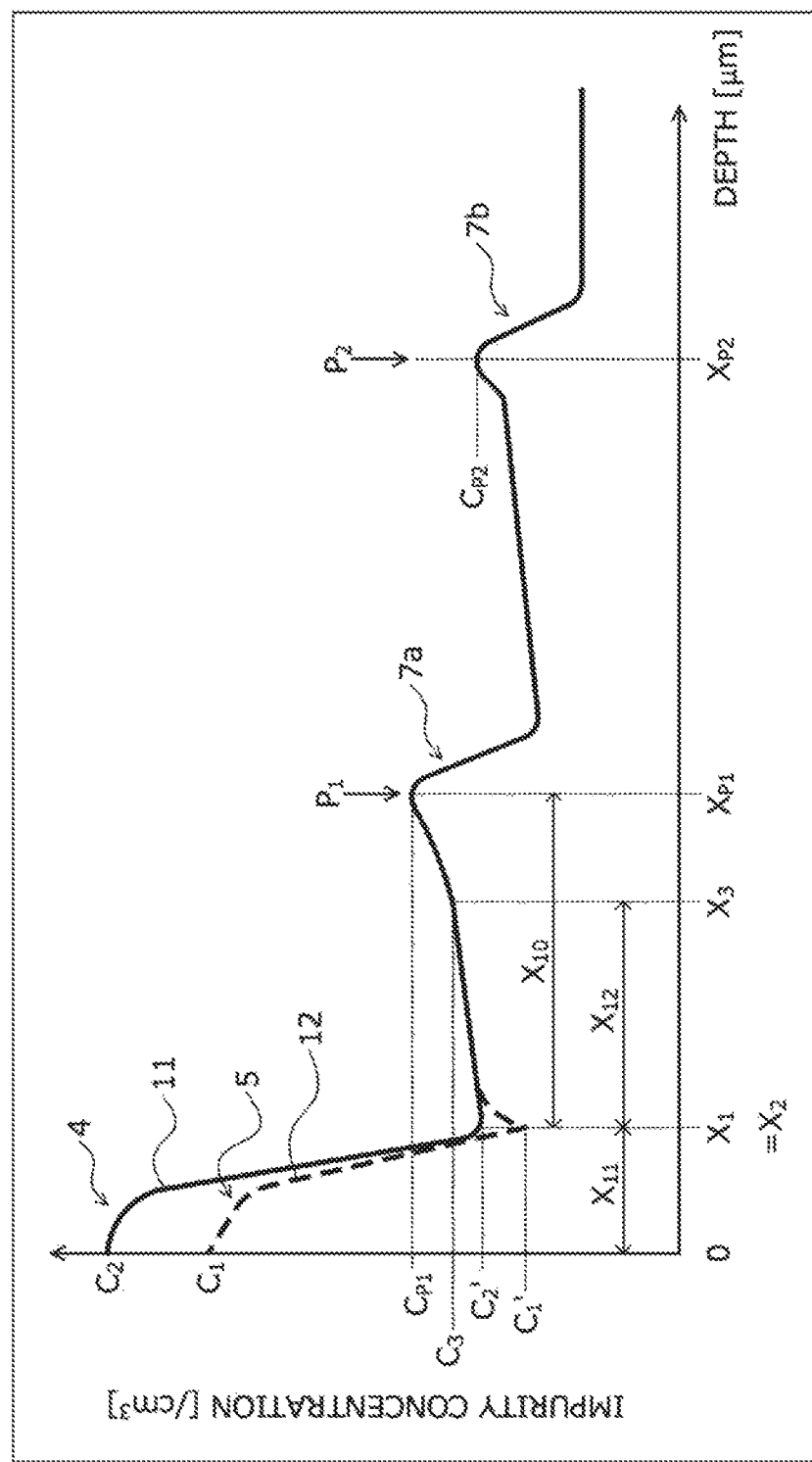
FIG. 2 is a characteristics diagram depicting impurity concentration distribution at cutting line A1-A2 and cutting line B1-B2 depicted in FIG. 1.

Configuration of the n$^+$-type cathode region 4 and the p-type cathode region 5 will be described. FIG. 2 is a characteristics diagram depicting impurity concentration distribution at cutting line A1-A2 and cutting line B1-B2 depicted in FIG. 1. In FIG. 2, an impurity concentration distribution 11 at cutting line A1-A2 is indicated by a solid line, an impurity concentration distribution 12 at cutting line B1-B2 is indicated by a dashed line. The impurity concentration distribution 12 at cutting line B1-B2 is in contact with the impurity concentration distribution 11 at cutting line A1-A2 at a position deeper from the rear surface 10a of the semiconductor substrate 10 than is a depth $X_1$. An impurity concentration distribution of a part deeper toward the anode (toward the p-type anode layer 2) from a part in contact with both of the impurity concentration distributions 11, 12 is the same for both of the impurity concentration distributions 11, 12 and therefore, indicated by only a solid line.

The impurity concentration distribution 11 at cutting line A1-A2 is an impurity concentration distribution of a part through the n$^+$-type cathode region 4 and the n-type FS layers 7a, 7b in the depth direction from the rear surface 10a of the semiconductor substrate 10. The impurity concentration distribution 12 at cutting line B1-B2 is an impurity concentration distribution of a part through the p-type cathode region 5 and the n-type FS layers 7a, 7b in the depth direction from the rear surface 10a of the semiconductor substrate 10. FIG. 2 depicts along a horizontal axis, depth from the rear surface 10a of the semiconductor substrate 10 (depth=0 μm) by an ordinary scale (not depicted) and depicts along a vertical axis, impurity concentration by a logarithmic scale (not depicted) (similarly in FIGS. 11, 18, 19 (b), 20(a), 21, and 22(a)).

The $n^+$-type cathode region 4, for example, is formed by ion implantation using phosphorus (P) as a dopant, acceleration energy of about 110 keV from the rear surface 10a of the semiconductor substrate 10, and a dose amount of about $3 \times 10^{15}/cm^2$. The p-type cathode region 5, for example, is formed by ion implantation using boron (B) as a dopant, acceleration energy of about 110 keV from the rear surface 10a of the semiconductor substrate 10, and a dose amount of about $1 \times 10^{14}/cm^2$. In the diode having the structure of the present example, the impurity concentration of the p-type cathode region 5 is set higher to a certain extent so that holes are injected from the p-type cathode region 5 to the n-type FS layers 7 ($n^-$-type drift layer 1) at the time of reverse recovery. A peak value (third maximum value) $C_1$ of the impurity concentration of the p-type cathode region 5 is lower than a peak value (second maximum value) $C_2$ of the impurity concentration of the $n^+$-type cathode region 4 and is higher than the peak $P_1$ of the impurity concentration of the n-type FS layer 7 (7a) nearest the cathode.

Further, the $n^+$-type cathode region 4 and the p-type cathode region 5 reach the same depths $X_2$, $X_1$ ($X_2 = X_1$) from the rear surface 10a of the semiconductor substrate 10. In other words, at the same depths $X_2$, $X_1$ from the rear surface 10a of the semiconductor substrate 10, an interface of the $n^+$-type cathode region 4 and the n-type FS layer 7a, and an interface of the p-type cathode region 5 and the n-type FS layer 7a are positioned. Impurity concentrations $50_2'$, $C_1'$ of the $n^+$-type cathode region 4 and the p-type cathode region indicate a lowest value at an interface with the n-type FS layer 7a. A peak value $C_1$ of the impurity concentration of the p-type cathode region 5 may be higher than a lowest value $C_2'$ of the impurity concentration of the $n^+$-type cathode region 4 at the interface of the $n^+$-type cathode region 4 and the n-type FS layer 7 (7a) nearest the cathode. Further, an impurity concentration of the p-type cathode region 5 at the interface with the n-type FS layer 7a is about 10 times lower than an impurity concentration $C_2'$ of the $n^+$-type cathode region 4 at the interface with the n-type FS layer 7a ($C_1' < C_2'$).

At the $n^+$-type cathode region 4 and the p-type cathode region 5, the impurity concentrations $C_2'$ at the respective interfaces with the n-type FS layer 7a differ because the n-type FS layers 7 are formed by proton implantation. In particular, as described above, the $n^+$-type cathode region 4 is formed by ion implantation of an n-type impurity such as phosphorus and the impurity concentration thereof becomes about 10 times higher than the impurity concentrations of the n-type FS layers 7 formed by proton implantation. Therefore, the impurity concentration $C_2'$ of the $n^+$-type cathode region 4 at the interface with the n-type FS layer 7a is rate-limited by the impurity concentration of the $n^+$-type cathode region 4 formed by ion implantation of, for example, phosphorus. In particular, the impurity concentration $C_2'$ of the $n^+$-type cathode region 4 at the interface with the n-type FS layer 7a is less than a peak value $C_{P1}$ of the impurity concentration of the n-type FS layer 7a nearest the cathode and may be, for example, in a range from about $1 \times 10^{14}/cm^3$ to $3 \times 10^{15}/cm^3$.

On the other hand, in the impurity concentration distribution 12 at cutting line B1-B2, a part at the depth $X_1$ from the rear surface 10a of the semiconductor substrate 10 is a p-type impurity concentration distribution of the p-type cathode region 5 and a part deeper than the depth $X_1$ from the rear surface 10a of the semiconductor substrate 10 is an n-type impurity concentration distribution of the n-type FS layers 7. The impurity concentration distribution 12 at cutting line B1-B2 has an impurity concentration distribution that protrudes sharply in a convex shape toward the low impurity concentration side, at the depth $X_1$ of a pn junction formed by the p-type cathode region 5 and the n-type FS layer 7a. In other words, the impurity concentration of the p-type cathode region 5 at the interface with the n-type FS layer 7a is determined by the impurity concentration at the cathode side of the n-type FS layer 7a formed by proton implantation and therefore, may be made about 10 times lower than the impurity concentration $C_2'$ of the $n^+$-type cathode region 4, which is rate-limited by the ion implantation of an n-type impurity such as phosphorus, the impurity concentration $C_2'$ at the interface with the n-type FS layer 7a.

Figure 17:
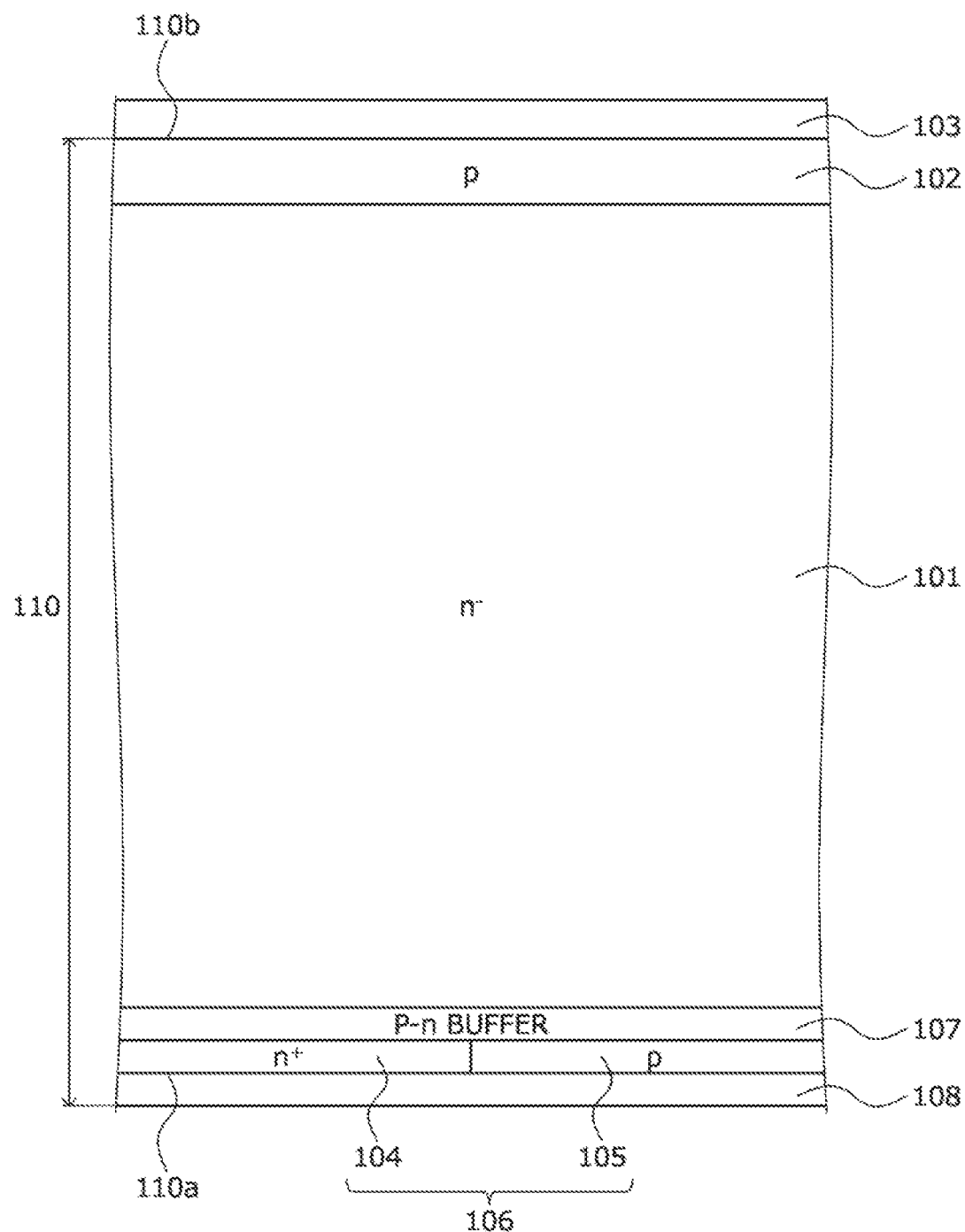
FIG. 17 is a cross-sectional view of a structure of a conventional diode.

In this manner, formation of the n-type FS layer 7 by proton implantation enables at the interface with the p-type cathode region 5, the impurity concentration of the n-type FS layer 7a to be reduced about 10 times lower than that of the conventional structure (refer to FIG. 17), which includes the P-n-type FS layer 107 formed by ion implantation of an n-type impurity such as phosphorus. As a result, the resistance of the n-type FS layer 7a near the interface with the p-type cathode region 5 may be increased, whereby a width (width in a direction parallel to the rear surface 10a of the semiconductor substrate 10) of the p-type cathode region 5 may be reduced as compared to the conventional structure that includes the P-n-type FS layer 107.

Reduction of the width of the p-type cathode region 5 enables the occupied area (surface are as viewed from the rear surface 10a of the semiconductor substrate 10) of the $n^+$-type cathode region 4 to be increased, thereby facilitating establishment of an occupied area of a pin (p-intrinsic-n) diode in the semiconductor substrate 10. Further, the width of the p-type cathode region 5 is reduced, whereby during steady state forward bias, holes that are supplied to the p-type anode layer 2 from the anode electrode 3 and move toward the cathode layer do not easily enter the p-type cathode region 5. Therefore, the forward voltage Vf may be prevented from increasing.

The impurity concentrations of the n-type FS layers 7a to 7d are higher than that of the $n^-$-type drift layer 1. Further, the peak values of the impurity concentrations of the n-type FS layers 7a to 7d are lower than the peak value (not depicted) of the impurity concentration of the p-type anode layer 2, the peak value $C_1$ of the impurity concentration of the p-type cathode region 5, and a peak value $C_2$ of the impurity concentration of the $n^+$-type cathode region 4. Further, the peak values of the impurity concentrations of the n-type FS layers 7a to 7d are lower, the deeper the position of the n-type FS layer 7a to 7d is from the rear surface 10a of the semiconductor substrate 10. Distances of the peak values of the impurity concentrations of the n-type FS layers 7a to 7d may be various changed according to design conditions. Further, the n-type FS layers 7a to 7d have mountain-shaped impurity concentration distributions, where the peaks of the impurity concentrations of are regarded as apexes and impurity concentration decreases toward the anode and the cathode.

The n-type FS layers 7a to 7d, for example, have impurity concentrations that are lower at the interface with a region adjacent on the anode side than impurity concentrations at the interface with a region adjacent on the cathode side. The adjacent region on the cathode side of the n-type FS layers 7a to 7d is the cathode layer 6 in the case of the n-type FS layer 7a and is the n-type FS layer 7a to 7c respectively adjacent on the cathode side in the case of the n-type FS layers 7b to 7d. The adjacent region on the anode side of the n-type FS layers 7a to 7d is the n-type FS layer 7a to 7c respectively adjacent on the anode side in the case of the n-type FS layers 7b to 7d and is the n⁻-type drift layer 1 in the case of the n-type FS layer 7d. Further, an impurity concentration slope of the n-type FS layers 7a to 7d, decreasing from the peak (apex) of the impurity concentration toward the cathode layer may be more gradual than the decrease from the peak toward the anode. Such impurity concentration distribution of the n-type FS layers 7a to 7d, for example, like Japanese Patent No. 5741712, may be formed by performing the subsequent proton implantation so as to compensate mobility decreases due to disorder remaining by proton implantation.

The n-type FS layer 7a nearest the cathode has an impurity concentration (=the impurity concentration $C_2$' of the n⁺-type cathode region 4 at the interface with the n-type FS layer 7a) at the interface with the n⁺-type cathode region 4 that is higher than the impurity concentration (=the impurity concentration of the p-type cathode region 5 at the interface with the n-type FS layer 7a) at the interface with the p-type cathode region 5. Further, the peak value $C_{P1}$ of the impurity concentration of the n-type FS layer 7a nearest the cathode is higher than the impurity concentration of the p-type cathode region 5 at the interface with the n-type FS layer 7a and the impurity concentration $C_2$' of the n⁺-type cathode region 4 at the interface with the n-type FS layer 7a ($C_{P1}>C_1$', $C_{P1}>C_2$') and is, for example, about $1\times10^{16}$/cm³.

A distance $X_{10}$ ($=X_{P1}-X_1$) from the peak position $X_{P1}$ of the impurity concentration of the n-type FS layer 7a nearest the cathode to a boundary of the p-type cathode region 5 and the n-type FS layer 7a, for example, is in a range from about 1 μm to 10 μm. As a result, during reverse bias, depletion layer suppression effect by the n-type FS layers 7 is obtained. Suitably, the distance $X_{10}$ from the peak position $X_{P1}$ of the impurity concentration of the n-type FS layer 7a to the boundary of the p-type cathode region 5 and the n-type FS layer 7a may be, for example, in a range from about 2 μm to 7 μm, and further may be, for example, in a range from about 3 μm to 5 μm. A reason for this is that the injection of holes from the p-type cathode region 5 during reverse recovery is ensured.

Of the parts closer to the cathode than is the peak $P_1$ of the impurity concentration of the n-type FS layer 7a, a part having an impurity concentration $C_3$ ($\leq 0.5 \cdot C_{P1}$ (may be $C_3 0.3 \leq C_{P1}$)) that is at most about 0.5 times (may be at most about 0.3 times, and further may be at most about 0.1 times) the peak value $C_{P1}$ of the impurity concentration of the n-type FS layer 7a reaches the predetermined depth $X_3$ from the boundary of the p-type cathode region 5 and the n-type FS layer 7a, in a range not reaching the peak position $X_{P1}$ of the impurity concentration of the n-type FS layer 7a. A distance $X_{12}$ ($=X_3-X_1$) from the predetermined depth $X_3$ to the boundary of the p-type cathode region 5 and the n-type FS layer 7a is greater than a thickness $X_{11}$ ($=X_1$) of the p-type cathode region 5 ($X_{11}<X_{12}<X_{10}$), and further may be at least about 2 times the thickness $X_{11}$ of the p-type cathode region 5 ($2 \cdot X_{11} \leq X_{12}$). Further, the distance $X_{12}$ from the predetermined depth $X_3$ to the boundary of the p-type cathode region 5 and the n-type FS layer 7a is at most 10 μm longer than the thickness $X_{11}$ of the p-type cathode region 5 ($X_{11}<X_{12} 10$ μm), and suitably may be at most 5 μm and further may be at most 3 μm. A reason for this is that the injection of holes from the p-type cathode region 5 during reverse recovery is ensured.

The p-type cathode region 5 and the n-type FS layer are provided so that $X_{11}<X_{12}$ is satisfied, whereby during reverse recovery, the injection of holes from the p-type cathode region 5 to the n-type FS layer 7a is facilitated, enabling the hole density toward the cathode layer to be increased. Therefore, at the time of reverse recovery (transition period of bias change), the current $I_{AK}$ between the anode and the cathode decreases, and even in a state where carrier concentration in the regions is low, waveforms of the voltage $V_{KA}$ between the cathode and the anode and the current $I_{AK}$ between the anode and the cathode do not oscillate easily. Results of simulation of an oscillation start voltage V of the voltage/current waveforms during reverse recovery are depicted in FIG. 3.

Figure 3:
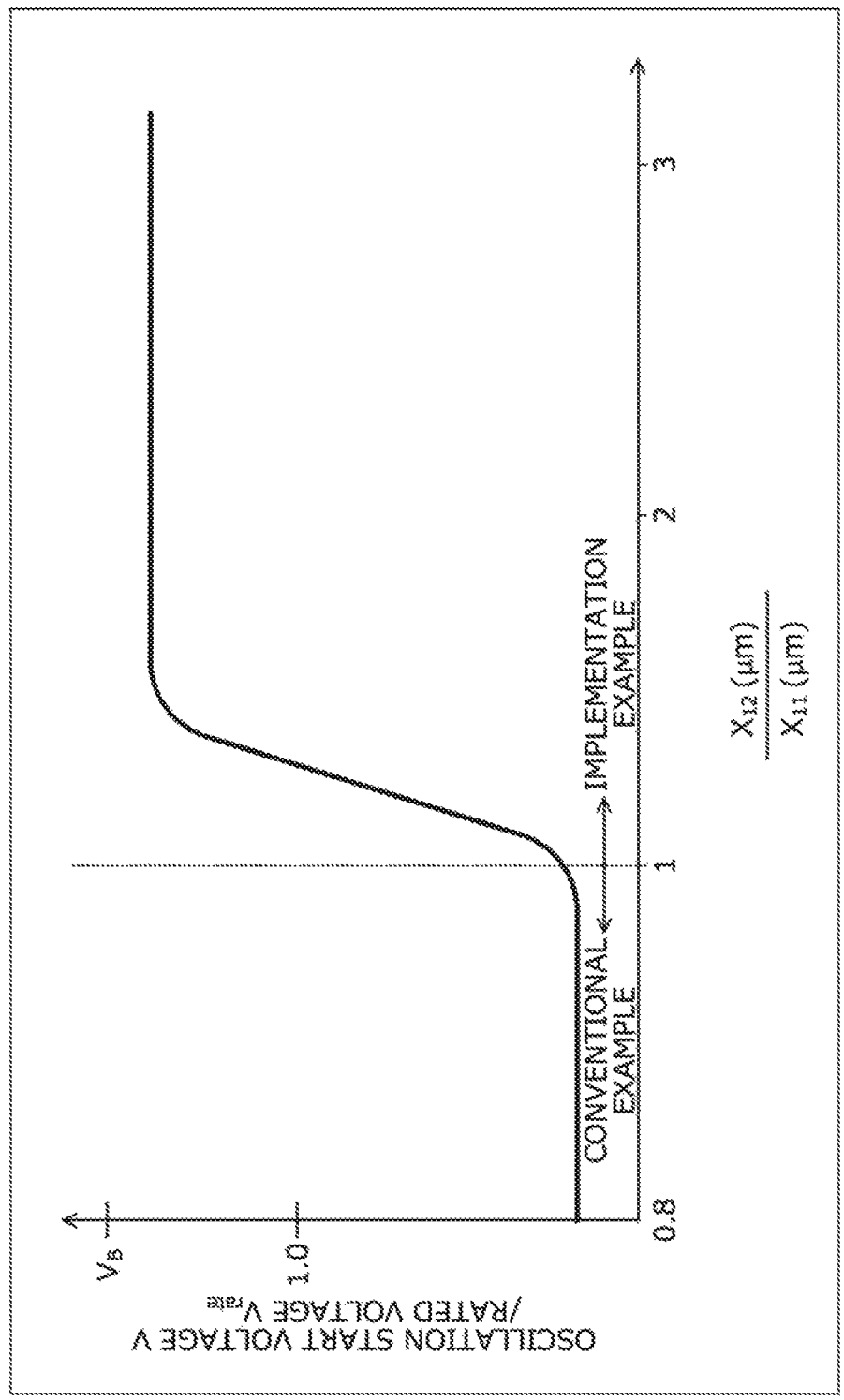
FIG. 3 is a characteristics diagram depicting an oscillation start voltage of voltage/current waveforms during reverse recovery.

FIG. 3 is a characteristics diagram depicting the oscillation start voltage of voltage/current waveforms during reverse recovery. In FIG. 3, a horizontal axis is a ratio of the distance $X_{12}$ from the depth $X_3$ to the boundary of the p-type cathode region 5 and the n-type FS layer 7a, to the thickness $X_{11}$ of the p-type cathode region 5, ($=X_{12}/X_{11}$). In FIG. 3, a vertical axis is a ratio ($=V/V_{rate}$) of the oscillation start voltage V of the voltage/current waveforms, to a rated voltage $V_{rate}$. The oscillation start voltage is as follows. When the diode is subject to reverse recovery by a predetermined power supply voltage $V_{bus}$, a value of the power supply voltage $V_{bus}$ is gradually increased from the power supply voltage $V_{bus}$ when a waveform of a voltage $V_{AK}$ of the diode or a waveform the current $I_{AK}$ of the diode does not oscillate, to again cause reverse recovery and the value of the power supply voltage $V_{bus}$ at which the waveform of the voltage $V_{AK}$ or of the current $I_{AK}$ starts to oscillate is regarded as the oscillation start voltage.

In FIG. 3, a configuration satisfying $X_{12}/X_{11}>1$ corresponds to the present disclosure (hereinafter, implementation example). On the other hand, a configuration that satisfies $X_{12}/X_{11} \leq 1$, for example, corresponds to the diode disclosed in Japanese Laid-Open Patent Publication No. 2010-283132 (hereinafter, conventional example). FIG. 3 illustrates that the implementation example is able to raise the oscillation start voltage V of the voltage/current waveforms to a greater extent than the conventional example and shows that the higher the oscillation start voltage V of the voltage/current waveforms is, the more difficult it is for oscillation to occur.

A factor enabling the implementation example to raise the oscillation start voltage V of the voltage/current waveforms to a greater extent as compared to conventional example is assumed to be as follows. Electrons accumulated in the n⁻-type drift layer 1 at the time of reverse recovery flow toward the cathode electrode 8 (toward the p-type cathode region 5). The electrons flowing toward the p-type cathode region 5 change course just before a first side of the p-type cathode region 5, the first side facing toward the front surface 10b of the semiconductor substrate 10, and proceed toward the n⁺-type cathode region 4 adjacent to the p-type cathode region 5 in a direction (horizontal direction) parallel to the front surface 10b of the semiconductor substrate 10 and reach the n⁺-type cathode region 4. The electrons at this time proceed along the horizontal direction just before the first side of the p-type cathode region 5, whereby a decrease in the voltage occurs. The decrease in the voltage occurs more easily the lower the resistance of the region of the distance $X_{12}$, i.e., the concentration of the n-type dopant is and the wider the region of the distance $X_{12}$ is in the depth direction. When the decrease in the voltage exceeds a built-in potential (about 0.7V) of a pn junction between the p-type cathode region 5 and the region of the distance $X_{12}$, holes are injected from the p-type cathode region 5. Further, the implementation example satisfies $X_{12}/X_{11} \geq 2$, thereby enabling the oscillation start voltage V of the voltage/current waveforms to be at least the rated voltage $V_{rate}$ ($V/V_{rate} \geq 1$).

Further, the implementation example satisfies $X_{12}/X_{11} \geq 2$ and therefore, the ratio of the oscillation start voltage V of the voltage/current waveforms to the rated voltage $V_{rate}$ becomes about an avalanche breakdown voltage $V_B$ of a diode or a constant value equal to or less than that. In FIG. 2, reference character $C_{P2}$ is the peak value of the impurity concentration of the n-type FS layer 7b adjacent to a side of the n-type FS layer 7a nearest the anode, the side facing toward the anode. Reference character $X_{P2}$ is a depth position of the peak $P_2$ of the impurity concentration of the n-type FS layer 7b, from the rear surface 10a of the semiconductor substrate 10. Although not depicted, a thickness and resistivity p of the semiconductor substrate 10, for example, are about 117 µm and 700 cm, respectively. The impurity concentration of the p-type anode layer 2, for example, is $1 \times 10^{13}/cm^3$.

Figure 4:
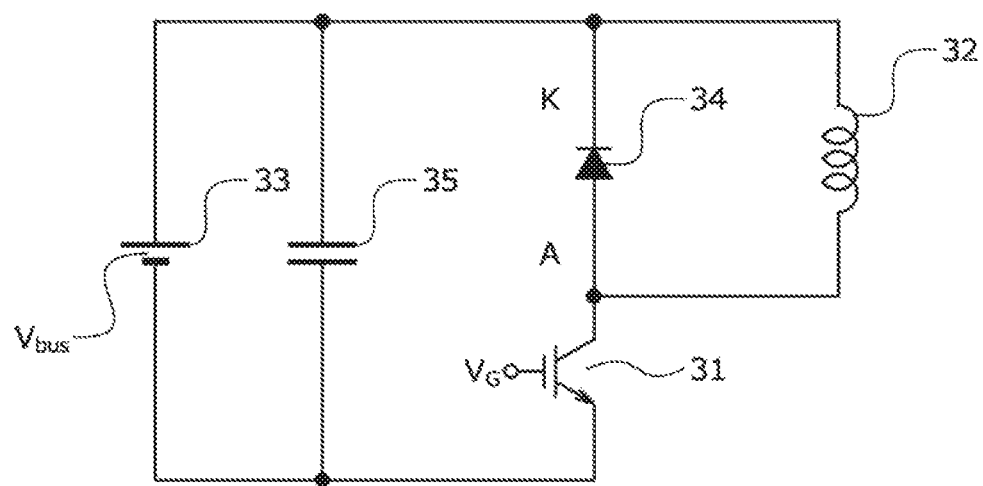
FIG. 4 is a circuit diagram of a circuit configuration of a chopper circuit used in a simulation depicted in FIG. 3.

An equivalent circuit of a general chopper circuit used in the simulation depicted in FIG. 3 is depicted in FIG. 4. FIG. 4 is a circuit diagram of a circuit configuration of the chopper circuit used in the simulation depicted in FIG. 3. The chopper circuit depicted in FIG. 4, for example, corresponds to one phase of an inverter. The collector of the IGBT 31 is connected to a positive electrode of a power supply 33, via an inductive load 32. An emitter of the IGBT 31 is connected to a negative electrode of the power supply 33. In a diode 34, an anode is connected to the collector of the IGBT 31 and a cathode is connected to the positive electrode of the power supply 33, whereby the diode 34 is connected in parallel with the inductive load 32. A capacitor 35 is charged and discharged by the IGBT 31 turning ON and OFF. The diode 34 corresponds to the implementation example above or the conventional example. The inductive load 32 corresponds to the load of wiring, etc.

In the chopper circuit depicted in FIG. 4, between the collector and the emitter of the IGBT 31, and between the cathode and the anode of the diode 34, the constant power supply voltage $V_{bus}$ is supplied alternately from the power supply 33. The diode 34 switches from reverse bias to forward bias when the power supply voltage $V_{bus}$ is supplied between the cathode and the anode. During a transition period (at the time of reverse recovery) for this switching from reverse bias to forward bias, due to an inductance L of the inductive load 32, surge voltage (=L (dI/dt)) higher than the power supply voltage $V_{bus}$ is applied between the cathode and the anode of the diode 34. The waveform of the voltage $V_{KA}$ between the cathode and the anode of the diode 34 oscillates when the surge voltage is a predetermined voltage value, becomes a maximum voltage $V_{KA\ \#peak}$ that is higher than the power supply voltage $V_{bus}$, and thereafter, settles at the power supply voltage $V_{bus}$ (refer to FIG. 14). Measurement results of the oscillation start voltage are depicted in FIG. 3.

Operation of the semiconductor device according to the first embodiment will be described. At the time of forward bias when positive voltage is applied to the anode electrode 3 and negative voltage is applied to the cathode electrode 8, electrons are supplied from the cathode electrode 8 to the $n^+$-type cathode region 4, and holes are supplied from the anode electrode 3 to the p-type anode layer 2. These carriers (electrons, holes) move toward the electrodes of differing polarities due to electric field occurring in the diode by forward bias of internal electric potential (e.g., in a case of silicon (Si), about 0.7V). In particular, electrons in the $n^+$-type cathode region 4 move toward the p-type anode layer 2, and holes in the p-type anode layer 2 move toward the $n^+$-type cathode region 4, whereby between the electrodes becomes conductive.

On the other hand, at the time of reverse bias when negative voltage is applied to the anode electrode 3, and positive voltage is applied to the cathode electrode 8, the carriers (electrons, holes) move in a direction opposite that at the time of forward bias. When a certain period of time elapses, a depletion layer is formed near the pn junction between the p-type anode layer 2 and the $n^-$-type drift layer 1, and between the electrodes is not conductive. At the time of reverse bias, holes are supplied from the cathode electrode 8 to the p-type cathode region 5, the hole density toward the cathode layer increases. As a result, during a transition period (at the time of reverse recovery) until a change to forward bias from reverse bias, the electric field strength toward the cathode layer is mitigated and oscillation of voltage/current waveforms during reverse recovery is suppressed.

Figure 5:
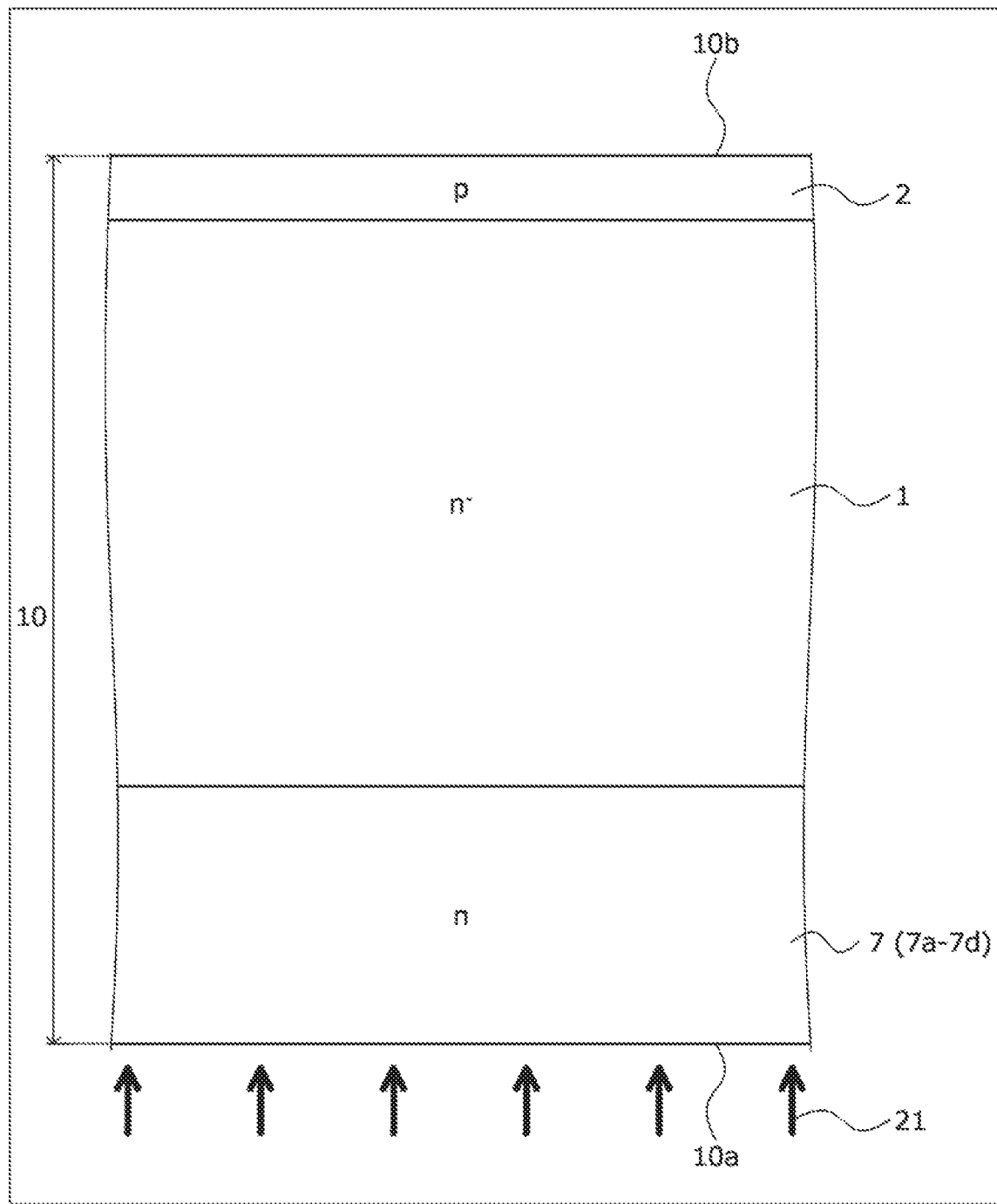
FIG. 5 is a cross-sectional view of the semiconductor device according to the first embodiment during manufacture.

A method of manufacturing the semiconductor device according to the first embodiment will be described. FIGS. 5, 6, 7, 8, and 9 are cross-sectional views of the semiconductor device according to the first embodiment during manufacture. First, as depicted in FIG. 5, the semiconductor substrate (semiconductor wafer) 10 of an $n^-$-type and constituting the $n^-$-type drift layer 1 is prepared. Next, by ion implantation of a p-type impurity, the p-type anode layer 2 is formed in the surface layer at the front surface 10b of the semiconductor substrate 10.

Next, grinding from the rear surface 10a of the semiconductor substrate 10 is performed, and the thickness of the semiconductor substrate 10 is reduced to a predetermined product thickness used for a semiconductor device (diode) and thereafter, by a proton implantation 21 of plural stages using differing acceleration energies from the rear surface 10a, the n-type FS layers 7 are formed at differing depths from the rear surface 10a of the semiconductor substrate 10. In FIG. 5, while the n-type FS layers 7 are collectively depicted as a single layer, as depicted in FIG. 1, the n-type FS layers 7a to 7d are formed respectively having peaks of the impurity concentration at differing depths from the rear surface 10a of the semiconductor substrate 10.

Figure 6:
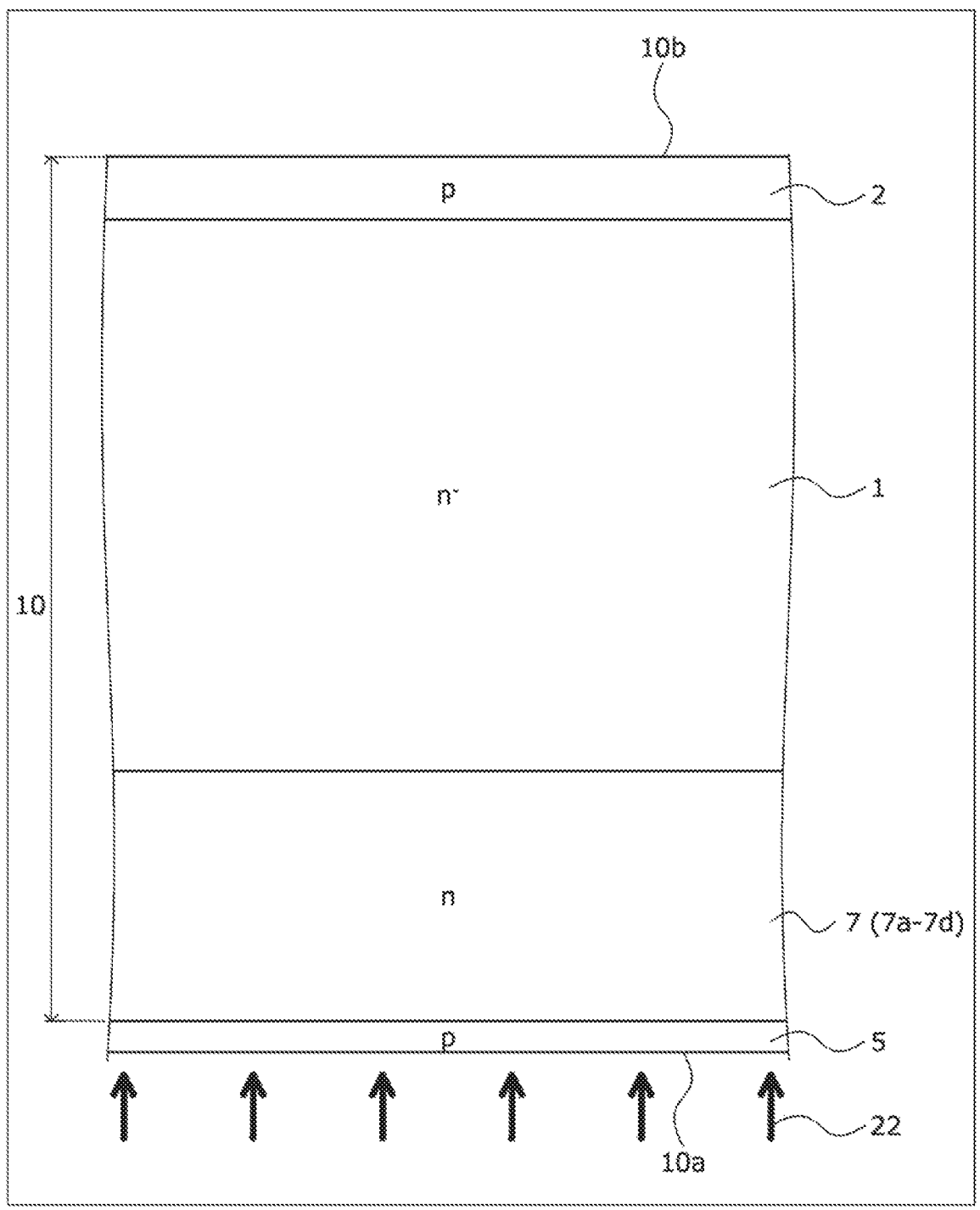
FIG. 6 is a cross-sectional view of the semiconductor device according to the first embodiment during manufacture.

Next, as depicted in FIG. 6, at the entire surface of the rear surface 10a of the semiconductor substrate 10, for example, ion implantation 22 of a p-type impurity such as boron is performed, whereby the p-type cathode region 5 is formed in the surface layer at the rear surface 10a of the semiconductor substrate 10. The peak value $C_1$ of the impurity concentration of the p-type cathode region 5, for example, may be in a range from about $1 \times 10^{16}/cm^3$ to $1 \times 10^{21}/cm^3$.

Figure 7:
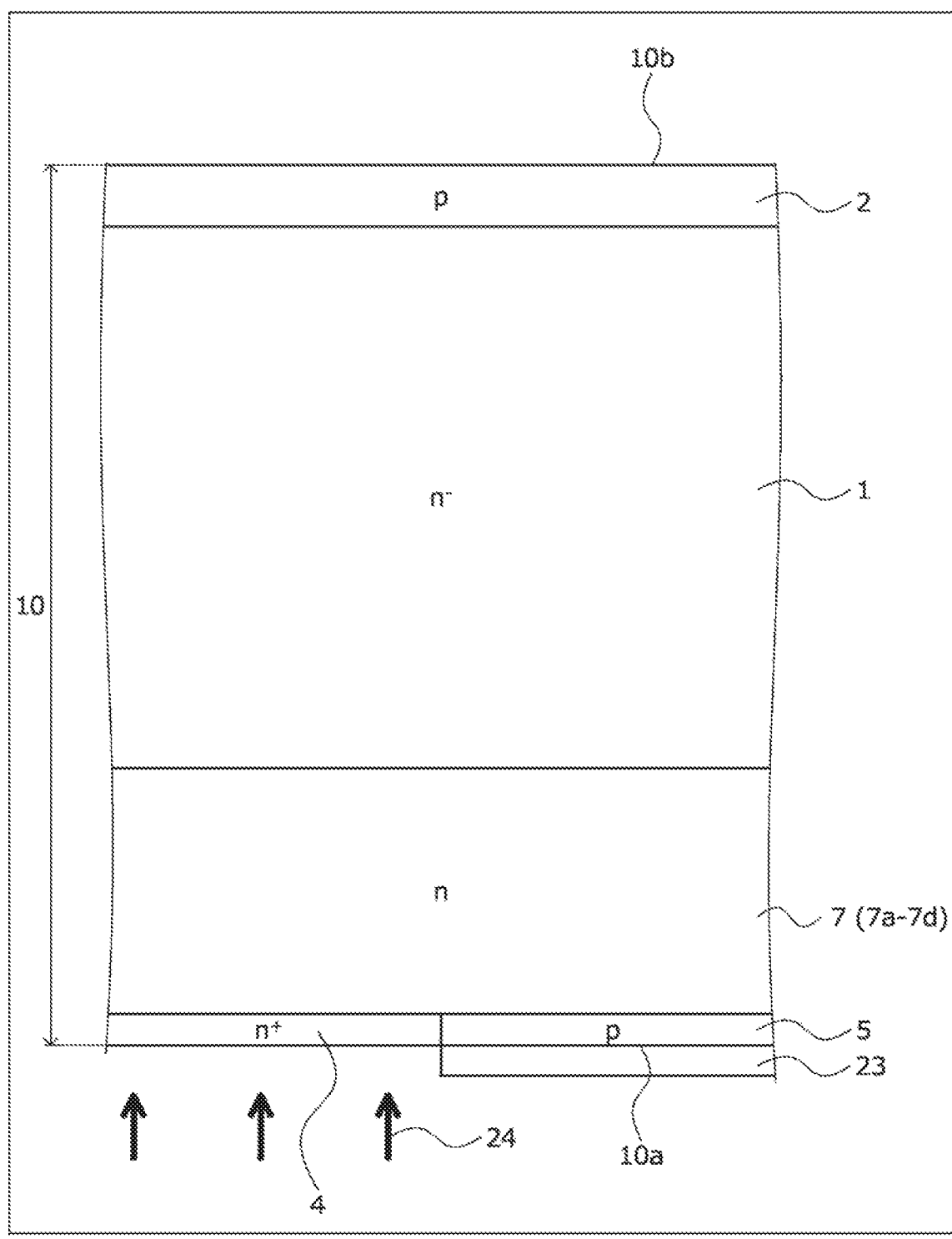
FIG. 7 is a cross-sectional view of the semiconductor device according to the first embodiment during manufacture.

Next, as depicted in FIG. 7, an ion implantation mask 23 opened at parts corresponding to formation regions of the $n^+$-type cathode region 4 is formed at the rear surface 10a of the semiconductor substrate 10. Next, the ion implantation mask 23 is used as a mask and ion implantation 24 of an n-type impurity such as phosphorus is performed, inverting the p-type cathode region 5 to an n-type, whereby the $n^+$-type cathode region 4 is selectively formed in the surface layer at the rear surface 10a of the semiconductor substrate 10. The peak value $C_2$ of the impurity concentration of the $n^+$-type cathode region 4, for example, may be in a range of about $1 \times 10^{17}/cm^3$ to $1 \times 10^{21}/cm^3$.

Figure 8:
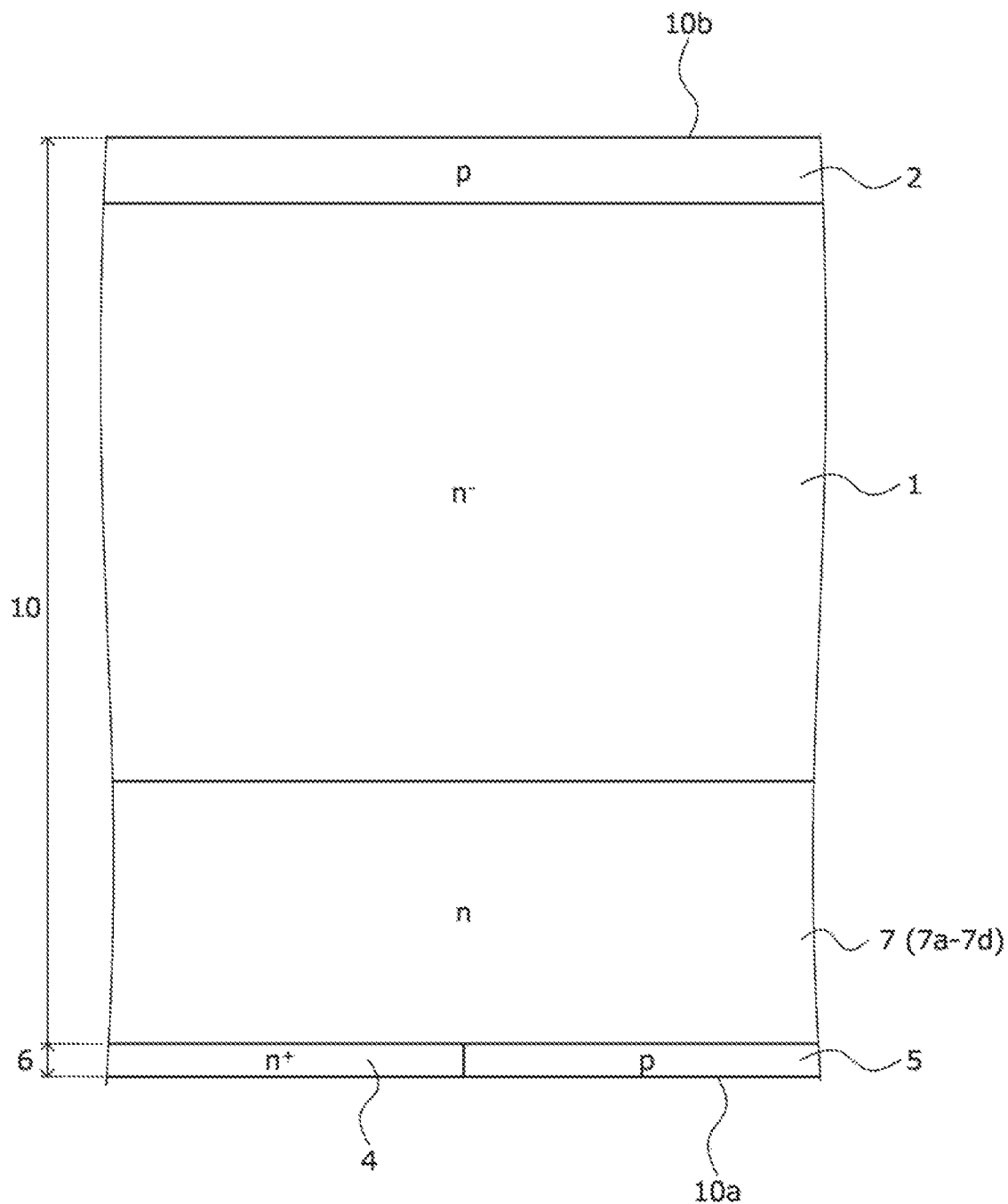
FIG. 8 is a cross-sectional view of the semiconductor device according to the first embodiment during manufacture.
Figure 9:
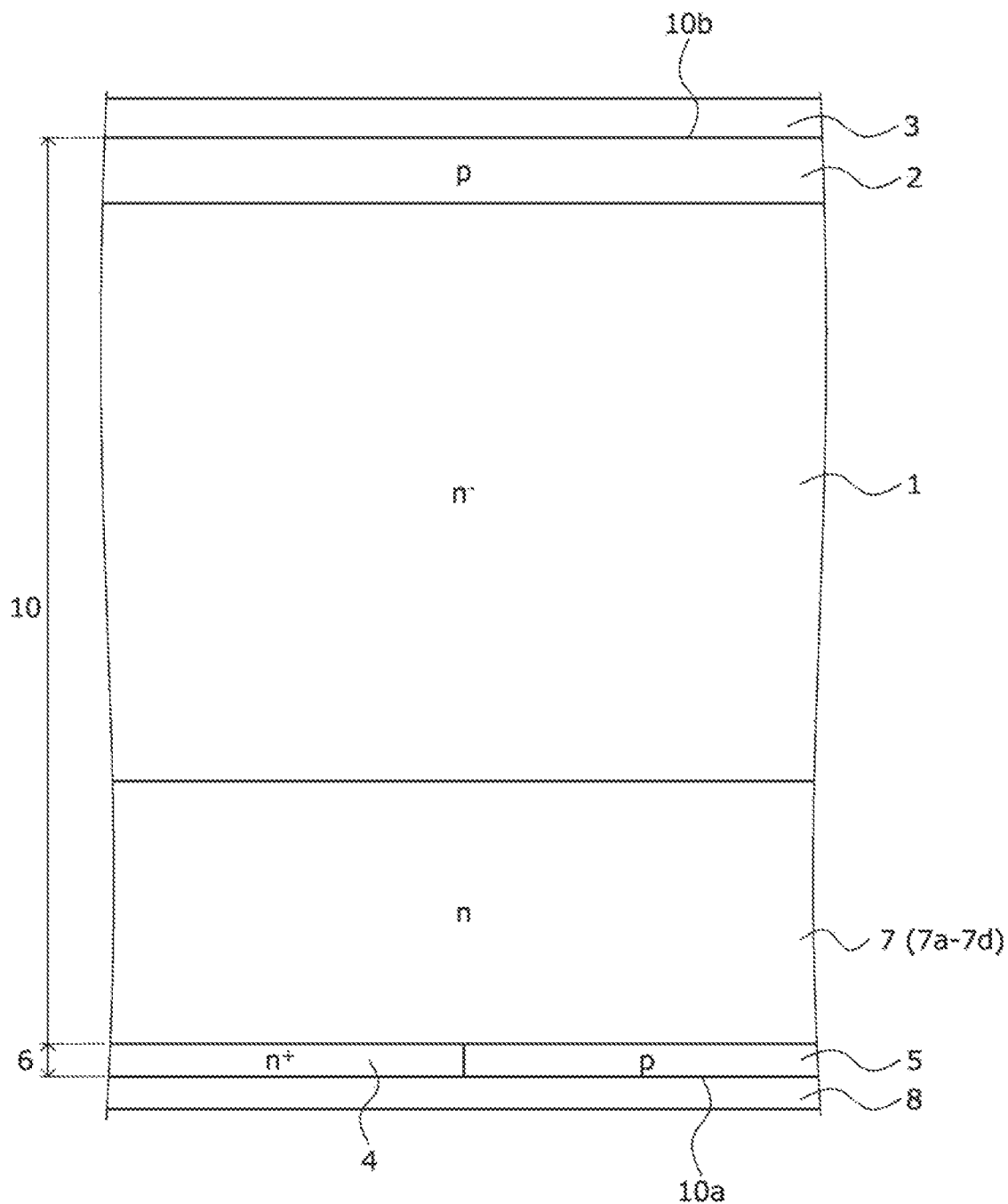
FIG. 9 is a cross-sectional view of the semiconductor device according to the first embodiment during manufacture.

Next, the ion implantation mask 23 is removed and thereafter, as depicted in FIG. 8, by an annealing process, the $n^+$-type cathode region 4, the p-type cathode region 5, and the n-type FS layers 7 are activated. Next, as depicted in FIG. 9, the anode electrode 3 is formed at the front surface 10b of the semiconductor substrate 10 and the cathode electrode 8 is formed at the rear surface 10a. Thereafter, the semiconductor wafer is cut (diced) into individual chips, whereby the diode depicted in FIG. 1 is completed.

As described, according to the first embodiment, the p-type cathode region is provided adjacent to the n⁺-type cathode region along a direction parallel to the rear surface of the semiconductor substrate, whereby at the time of reverse recovery of the diode, holes are injected from the cathode electrode into the p-type cathode region, increasing the hole density toward the cathode layer. As a result, electric field toward the cathode layer is mitigated and oscillation of voltage/current waveforms during reverse recovery is suppressed, enabling reverse recovery loss to be reduced. Further, a distance from the peak position of the impurity concentration of the n-type FS layer nearest the cathode layer to the boundary of the p-type cathode region and the n-type FS layer and the impurity concentration distribution are set within a range of the above conditions and hole injection efficiency is adjusted, whereby during steady state forward bias, the hole density toward the anode layer of the n⁻-type drift layer decreases, and the hole density toward the cathode layer increases by the amount of decrease. Therefore, increase of the forward voltage Vf may be prevented. Therefore, the tradeoff relationship of reducing forward voltage and reducing reverse recovery loss may be improved.

Further, according to the first embodiment, the n-type FS layers having differing peak positions of the impurity concentration in the depth direction are provided, whereby at the time of reverse recovery, a depletion layer does not easily spread from the pn junction between the p-type anode layer and the type drift layer, making reach-through to the p-type cathode region difficult. Therefore, at the time of reverse recovery, a parasitic pnp transistor constituted by the p-type anode layer, the n⁻-type drift layer and the p-type cathode region operates, enabling destruction of the diode to be prevented. Further, at the time of reverse recovery, a depletion layer does not easily spread from the pn junction between the p-type anode layer and the n⁻-type drift layer, whereby voltage between the cathode and the anode may be suppressed, and oscillation of voltage/current waveforms during reverse recovery is suppressed.

Further, according to the first embodiment, the p-type cathode region is formed at the entire rear surface of the semiconductor substrate, a part of the p-type cathode region is inverted to an n-type, forming the n⁺-type cathode region, whereby the p-type cathode region and the n⁺-type cathode region may be assuredly in contact with each other irrespective of ion implantation variation or mask variation.

Figure 10:
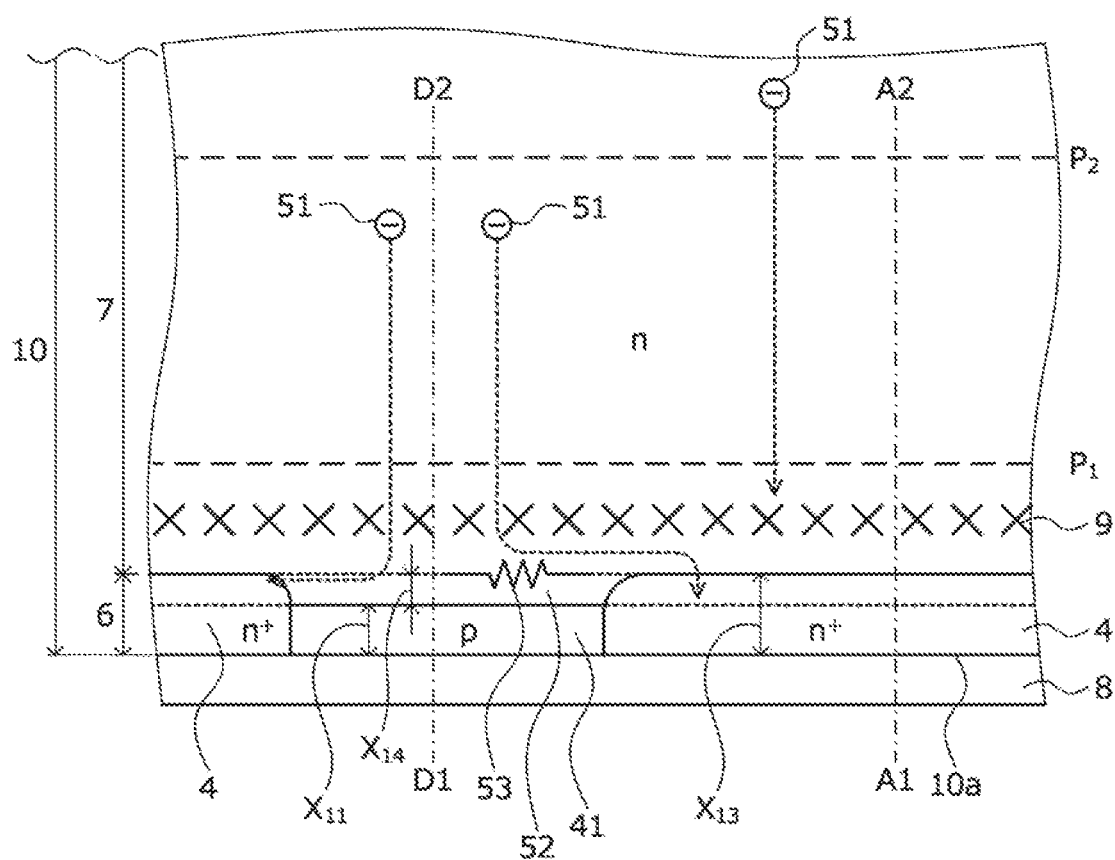
FIG. 10 is a cross-sectional view of a structure of constituent parts of the semiconductor device according to a second embodiment.

A structure of the semiconductor device according to a second embodiment will be described. FIG. 10 is a cross-sectional view of a structure of constituent parts of the semiconductor device according to the second embodiment. In FIG. 10, a configuration of the rear surface 10a of the semiconductor substrate 10 is depicted and a configuration of the front surface 10b is not depicted. Further, regarding the n-type FS layers 7, only the peaks $P_1$, $P_2$ of the impurity concentrations of the n-type FS layers 7a, 7b (refer to FIGS. 1, 2) are depicted. The semiconductor device according to the second embodiment differs from the semiconductor device according to the first embodiment in that in the n⁺-type cathode region 4 and the p-type cathode region 41 constituting the cathode layer 6, the thickness $X_{11}$ of the p-type cathode region 41 is thinner than a thickness $X_{13}$ of the n⁺-type cathode region 4.

The region 52 of the n-type FS layer 7a opposing the p-type cathode region 41 in the depth direction protrudes closer toward the rear surface 10a of the semiconductor substrate 10 than is the interface of the n⁺-type cathode region 4 and the n-type FS layer 7a, by a thickness $X_{14}$ (=$X_{13}$-$X_{11}$). At the time of reverse recovery, when electrons 51 supplied from the anode electrode 3 move to the n⁺-type cathode region 4, holes are supplied to the region 52 from p-type cathode region 41 due to a voltage decrease of 0.7V at resistance (diffusion layer resistance) 53 formed by the region 52 of the n-type FS layer 7a opposing the p-type cathode region 41 in the depth direction. As a result, oscillation of voltage/current waveforms during reverse recovery is further suppressed.

Figure 11:
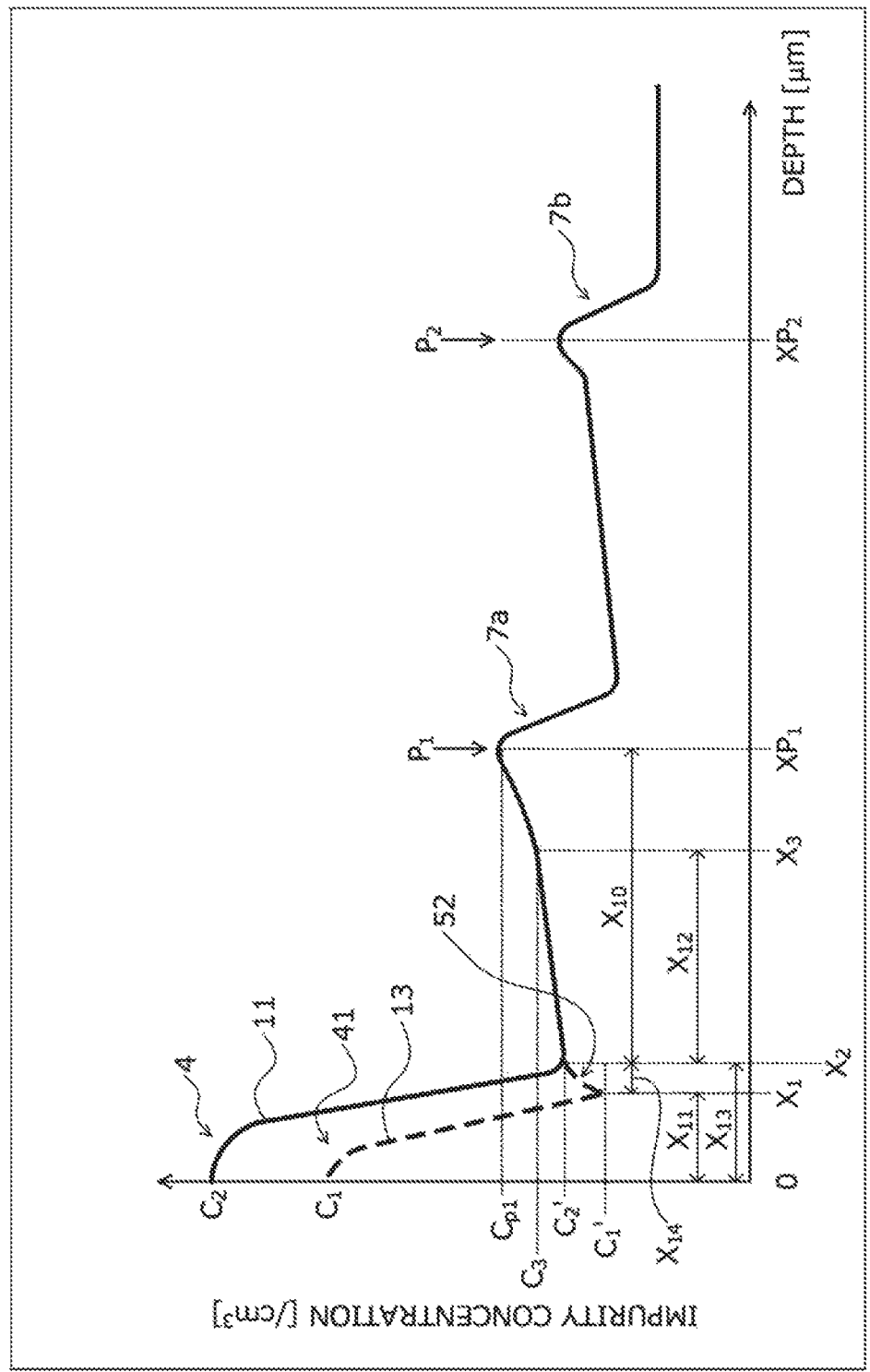
FIG. 11 is a characteristics diagram depicting an impurity concentration distribution at cutting line A1-A2 and cutting line D1-D2 depicted in FIG. 10.

FIG. 11 is a characteristics diagram depicting an impurity concentration distribution at cutting line A1-A2 and cutting line D1-D2 depicted in FIG. 10. In FIG. 11, the impurity concentration distribution 11 at cutting line A1-A2 is depicted by a solid line and an impurity concentration distribution 13 at cutting line D1-D2 is indicated by a dashed line. The impurity concentration distribution 11 at cutting line A1-A2 is similar to that of the first embodiment. The impurity concentration distribution 13 at cutting line D1-D2 is in contact with the impurity concentration distribution 11 at cutting line A1-A2 at a position deeper than the depth $X_2$. An impurity concentration distribution of a deep part from a part where both of the impurity concentration distributions 11, 13 are in contact is equivalent to the impurity concentration distributions 11, 13 and therefore, only a solid line is depicted.

The impurity concentration distribution 13 at cutting line D1-D2 is an impurity concentration distribution of a part through the p-type cathode region 41 and the n-type FS layers 7a, 7b, from the rear surface 10a of the semiconductor substrate 10 in the depth direction. In the impurity concentration distribution 13 at cutting line D1-D2, the part that is at the depth $X_1$ from the rear surface 10a of the semiconductor substrate 10 is a p-type impurity concentration distribution of the p-type cathode region 41 and a part that is deeper from the rear surface 10a of the semiconductor substrate 10 than is the depth $X_1$ is an n-type impurity concentration distribution of the n-type FS layers 7. The depth $X_1$ of the interface of the p-type cathode region 41 and the n-type FS layer 7a is positioned at a depth that is shallower than the depth $X_2$ of the interface of the n⁺-type cathode region 4 and the n-type FS layer 7a, from the rear surface 10a of the semiconductor substrate 10 ($X_1 < X_2$).

A method of manufacturing the semiconductor device according to the second embodiment includes in the method of manufacturing the semiconductor device according to the first embodiment, setting the acceleration energy of the ion implantation 22 for forming the p-type cathode region 5 to be lower than the acceleration energy of the ion implantation 24 for forming the n⁺-type cathode region 4. In particular, the p-type cathode region 5, for example, may be formed by ion implantation that uses boron as a dopant, acceleration energy of about 45 keV from the rear surface 10a of the semiconductor substrate 10, and a dose amount of about $1 \times 10^{14}$/cm². Conditions of the ion implantation 24 for forming the n⁺-type cathode region 4 are similar to the conditions according in the first embodiment.

As described, according to the second embodiment, effects similar to those of the first embodiment may be obtained. Further, according to the second embodiment, the thickness of the p-type cathode region is thinner than the thickness of the n⁺-type cathode region, whereby oscillation of voltage/current waveforms during reverse recovery may be further suppressed.

Figure 12:
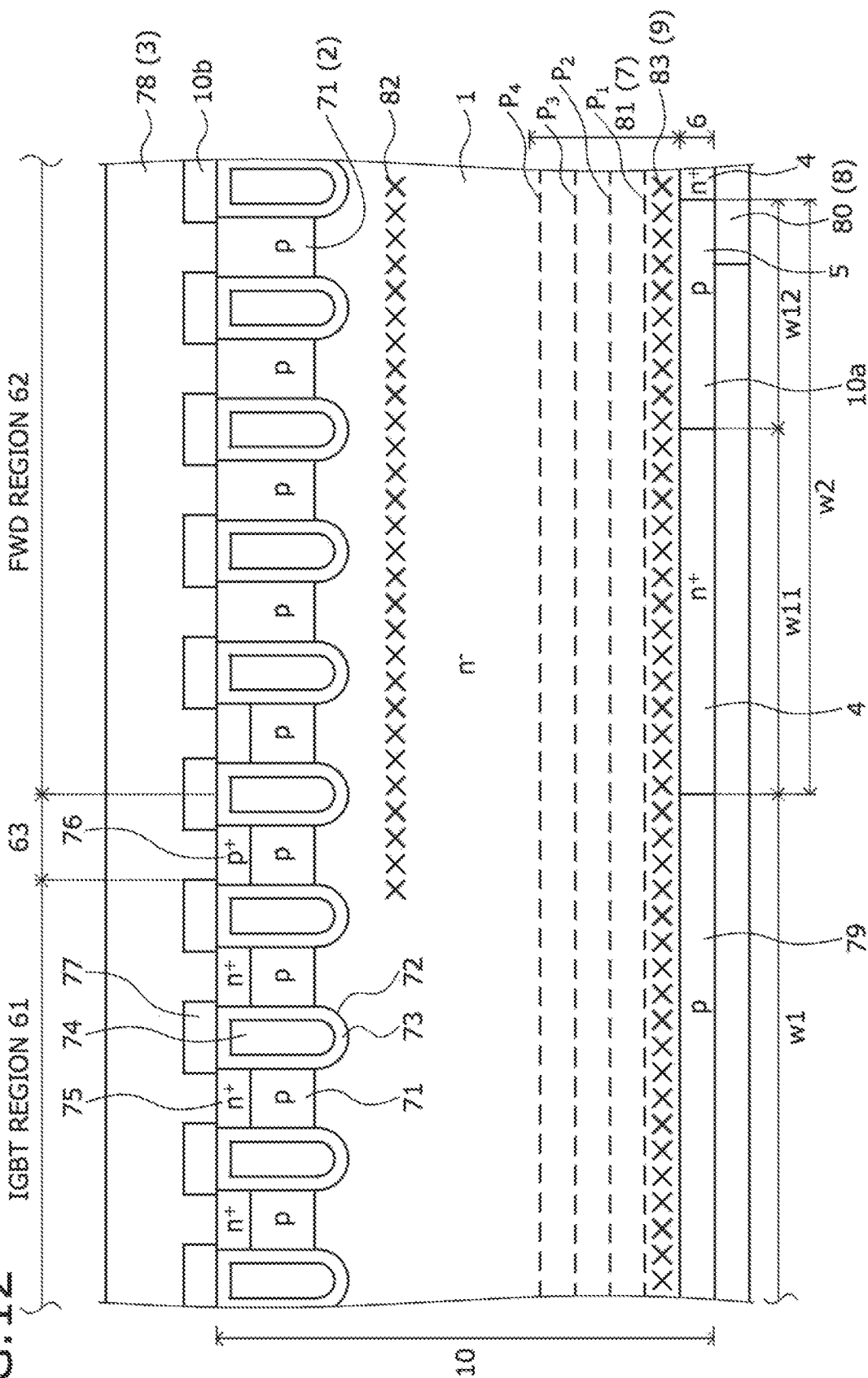
FIG. 12 is a cross-sectional view of a structure of the semiconductor device according to a third embodiment.

A structure of the semiconductor device according to a third embodiment will be described. FIG. 12 is a cross-sectional view of a structure of the semiconductor device according to the third embodiment. The semiconductor device according to the third embodiment differs from the semiconductor device according to the first embodiment in that in the same semiconductor substrate 10, an insulated gate bipolar transistor (IGBT) and a diode are formed.

In other words, the semiconductor device according to the third embodiment is a reverse conducting-IGBT (RC-IGBT) having a FS structure and to which the first embodiment is applied. In particular, on the single semiconductor substrate 10 constituting the n⁻-type drift layer 1, an IGBT region 61 in which the IGBT is disposed and a FWD region 62 in which a free wheeling diode (FWD) is disposed are provided. The FWD of the FWD region 62 is the semiconductor device according to the first embodiment (refer to FIGS. 1, 2) and is connected in reverse parallel to the IGBT region 61.

More specifically, in the IGBT region 61, in the surface layer at the front surface 10b of the semiconductor substrate 10, a p-type base region 71 is provided. A trench 72 penetrates the p-type base region 71 from the front surface 10b of the semiconductor substrate 10 in a direction opposite the depth direction and reaches the n⁻-type drift layer 1. Further, the trench 72, for example, is disposed in a layout having a striped shape that as viewed from the front surface 10b of the semiconductor substrate 10, planarly, extends along a direction (direction parallel to the direction of view in FIG. 12) orthogonal to a direction (horizontal direction in the plane of view in FIG. 12) along which the IGBT region 61 and the FWD region 62 are arranged.

The p-type base region 71 is separated into plural regions (mesa parts) by the trench 72, which is provided in plural. In the trench 72, a gate electrode 74 is provided via a gate insulating film 73. In the mesa parts of the p-type base region 71 sandwiched between adjacent trenches 72, an n⁺-type emitter region 75 and a p⁺-type contact region 76 (not depicted in the IGBT region 61) are selectively provided. The n⁺-type emitter region 75 opposes the gate electrode 74, across the gate insulating film 73 at a side wall of the trench 72.

The p⁺-type contact region 76 is disposed closer to a center part of the mesa part than is the n⁺-type emitter region 75 and is in contact with the n⁺-type emitter region 75. The p-type base region 71, the trench 72, the gate insulating film 73, the gate electrode 74, the n⁺-type emitter region 75 and the p⁺-type contact region 76 constitute a MOS gate having a trench gate structure. At a part sandwiched between centers of adjacent mesa parts, one unit cell (constituent unit of an element) is configured. On the front surface 10b of the semiconductor substrate 10, an interlayer insulating film 77 is provided so as to cover the gate electrodes 74.

An emitter electrode 78 is in contact with the n⁺-type emitter region 75 and the p⁺-type contact region 76 via a contact hole penetrating the interlayer insulating film 77 and is electrically connected with the p-type base region 71, the n⁺-type emitter region 75 and the p⁺-type contact region 76. Further, the emitter electrode 78 is electrically connected with the gate electrode 74 by the interlayer insulating film 77. In the surface layer at the rear surface 10a of the semiconductor substrate 10, a p-type collector layer 79 is selectively provided. The p-type collector layer 79 extends to an intermediate region 63 described hereinafter and the FWD region 62. A collector electrode 80 is in contact with the p-type collector layer 79.

In the FWD region 62, toward the front surface 10b of the semiconductor substrate 10, the p-type base region 71, the trench 72 (including the gate insulating film 73 and the gate electrode 74 in the trench 72), the interlayer insulating film 77, the emitter electrode 78, and the collector electrode 80 are provided, similarly in the IGBT region 61. The p-type base region 71, the emitter electrode 78 and the collector electrode 80, in the FWD region 62 respectively also serve as a p-type anode region, an anode electrode and a cathode electrode of the FWD, and correspond to the p-type anode layer 2, the anode electrode 3 and the cathode electrode 8 of the first embodiment. In the FWD region 62, the n⁺-type emitter region 75 and the p⁺-type contact region 76 are not provided.

In the surface layer at the rear surface 10a of the semiconductor substrate 10, similarly to the first embodiment, the cathode layer 6 (the n⁺-type cathode region 4 and the p-type cathode region 5) is selectively provided. The n⁺-type cathode region 4 is in contact with the p-type collector layer 79. In other words, the n⁺-type cathode region 4 is provided furthest on the IGBT region 61 side of the FWD region 62, the p-type cathode region 5 is provided on a side of n⁺-type cathode region 4, opposite that facing toward the p-type collector layer 79. The n⁺-type cathode region 4 and the p-type cathode region 5 may be provided in the FWD region 62, alternating each other along a direction parallel to the rear surface 10a of the semiconductor substrate 10.

The impurity concentration of the p-type cathode region 5 is provided to be lower as compared to a case where the present invention is applied to a diode having a RFC structure (corresponds to the first and the second embodiments). In particular, the p-type cathode region 5, for example, is formed by ion implantation using boron as a dopant, acceleration energy of about 45 keV from the rear surface 10a of the semiconductor substrate 10, and a dose amount of about $2 \times 10^{13}/cm^2$. While not particularly limited hereto, a width (width along a direction parallel to the rear surface 10a of the semiconductor substrate 10) w1 of the p-type collector layer 79, for example, is about 500 μm or less. A width w2 of the cathode layer 6, for example, is about 200 μm or less. The widths 5w11, w12 of the n⁺-type cathode region 4 and the p-type cathode region, for example, are about 50 μm or less.

In the n⁻-type drift layer 1, at a part deeper from the rear surface 10a of the semiconductor substrate 10 than is the cathode layer 6, an n-type FS layer 81 is provided. The n-type FS layer 81 corresponds to the n-type FS layers 7 of the first embodiment. The n-type FS layer 81, similarly to the first embodiment, is disposed in plural (here, 4). In FIG. 12, only the peaks $P_1$ to $P_4$ of the impurity concentrations of the n-type FS layers 81 are depicted. The n-type FS layer 81 is provided spanning the IGBT region 61 and the FWD region 62.

Further, in the n⁻-type drift layer 1, for example, crystal defects 82, 83 that are lifetime killers may be introduced by helium irradiation in the FWD region 62, near a boundary with the p-type anode region (the p-type base region 71) and near a boundary with the cathode layer 6. The crystal defects 82, 83 may extend to a boundary of the IGBT region 61 with the intermediate region 63. The crystal defects 83 introduced near the boundary with the cathode layer 6 correspond to the crystal defects 9 of the first embodiment.

Between the IGBT region 61 and the FWD region 62, the intermediate region 63 is provided. In the intermediate region 63, the n+-type emitter region 75 is not provided. The intermediate region 63 has a function of reducing the carrier concentration to be lower than that of the FWD region 62 and of reducing interference of operation to the IGBT of the IGBT region 61, when the FWD of the FWD region 62 operates. A part of the semiconductor substrate 10 excluding the p-type base region 71, the p-type collector layer 79 and the cathode layer 6 constitutes the n−-type drift layer 1.

Further, the semiconductor device according to the second embodiment (FIGS. 10, 11) may be applied as the FWD of the FWD region 62.

As described, according to the second embodiment, even with application to a RC-IGBT, effects similar to those of the first embodiment may be obtained.

Figure 13:
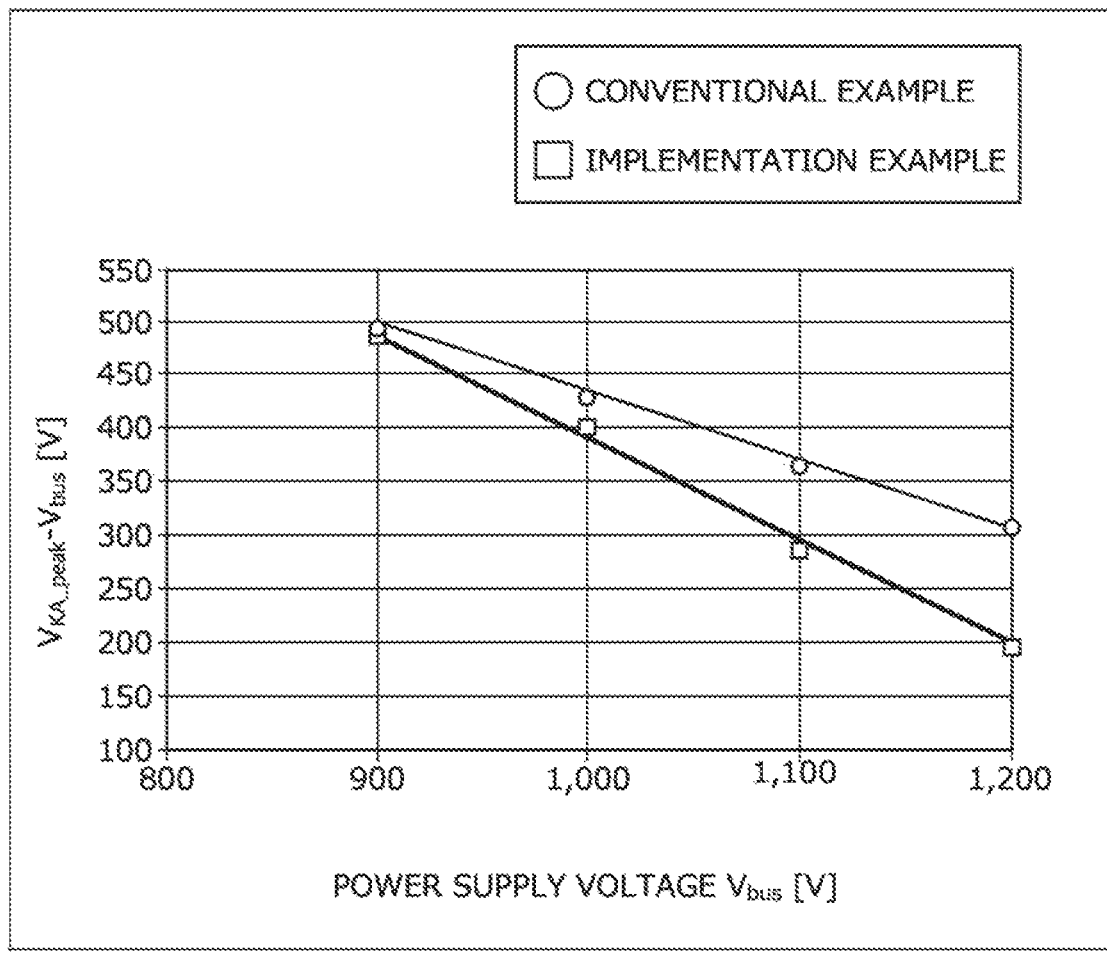
FIG. 13 is a characteristics diagram depicting voltage between a cathode and an anode at a time of reverse recovery of a diode.
Figure 14:
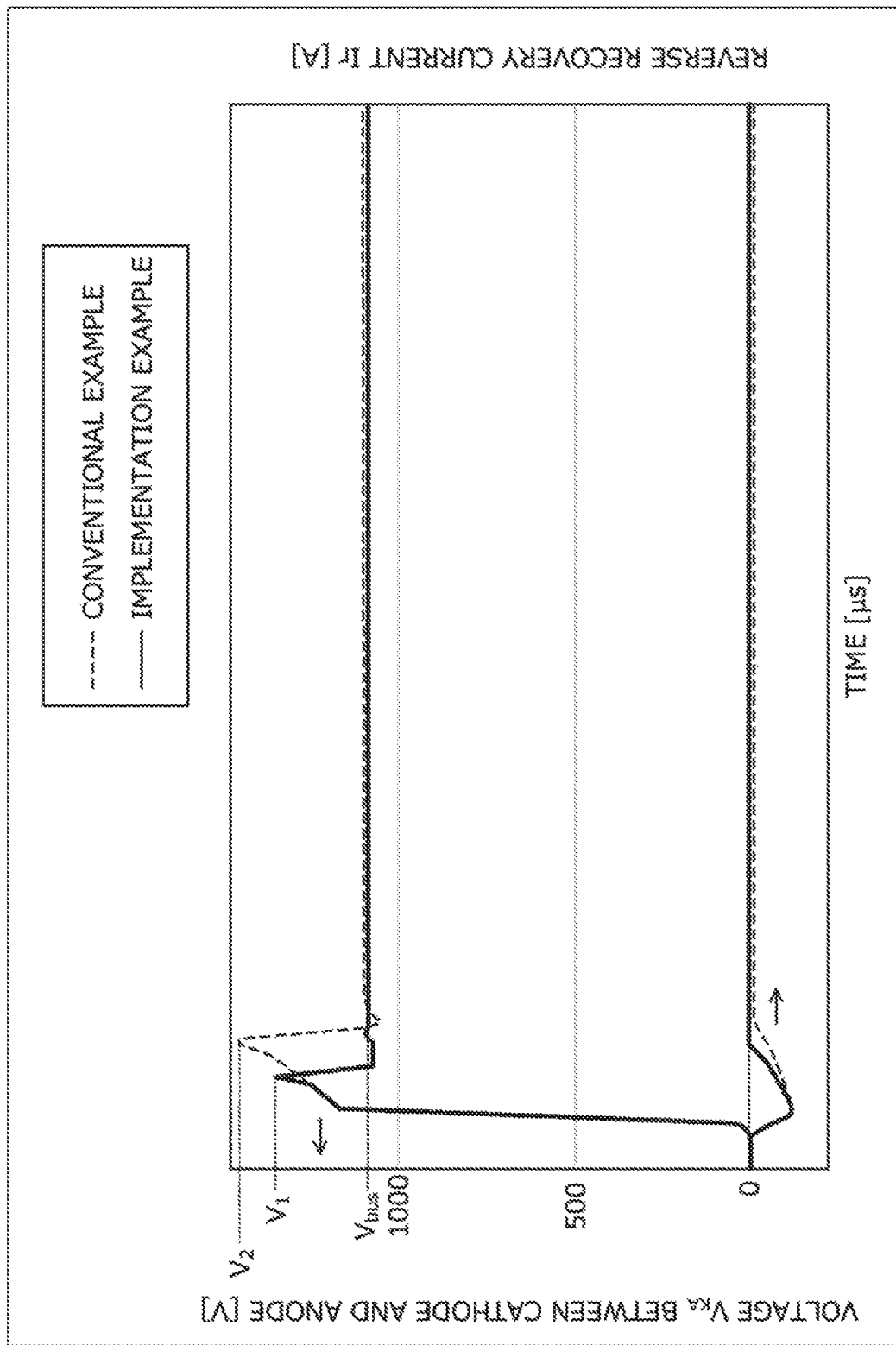
FIG. 14 is a characteristics diagram depicting an example of a waveform of voltage between the cathode and the anode during reverse recovery of the diode.

A waveform of the voltage $V_{KA}$ between the cathode and the anode of the described implementation example (the RFC structure diode including the n-type FS layers 7 formed by the multiple proton implantations depicted in FIG. 1) was verified by simulation. FIG. 13 is a characteristics diagram depicting voltage between the cathode and the anode at the time of reverse recovery of the diode. FIG. 14 is a characteristics diagram depicting an example of a waveform of the voltage between the cathode and the anode during reverse recovery of the diode. In FIG. 13, a horizontal axis is the power supply voltage $V_{bus}$ while a vertical axis is a value (=$V_{KA\ \#Peak}-V_{bus}$) obtained when the power supply voltage $V_{bus}$ is subtracted from the maximum voltage $V_{KA\ \#peak}$ at the time of oscillation of the voltage $V_{KA}$ between the cathode and the anode.

In FIG. 13, for comparison, a characteristics diagram of the voltage $V_{KA}$ between the cathode and the anode for the described conventional example (the RFC structure diode including one n-type FS layer formed by ion implantation of phosphorus, etc.) is also depicted. The maximum voltage $V_{KA}\#_{Peak}$ at the time of oscillation of the voltage $V_K$, between the cathode and the anode is the maximum voltage of the voltage $V_{KA}$ between the cathode and the anode during an interval after the voltage $V_{KA}$ oscillates during reverse recovery and becomes higher than the power supply voltage $V_{bus}$ until the voltage $V_{KA}$ settles down at the power supply voltage $V_{bus}$. In particular, the maximum voltage $V_{KA\ \#peak}$ at the time of oscillation of the voltage $V_{KA}$ between the cathode and the anode in the implementation example, as depicted in FIG. 14, corresponds to the maximum voltage $V_1$ that is higher than the power supply voltage $V_{bus}$ before the voltage $V_{KA}$ between the cathode and the anode settles down at the power supply voltage $V_{bus}$. The maximum voltage $V_{KA\ \#peak}$ at the time of oscillation of the voltage $V_{KA}$ between the cathode and the anode in the conventional example, as depicted in FIG. 14, corresponds to the maximum voltage $V_2$ that is higher than the power supply voltage $V_{bus}$ before the voltage $V_{KA}$ between the cathode and the anode settles down at the power supply voltage $V_{bus}$.

From the results depicted in FIG. 13, implementation example, it was confirmed that the maximum voltage $V_{KA\ \#peak}$ at the time of oscillation of the voltage $V_{KA}$ between the cathode and the anode may be reduced to a greater extent than in the conventional example.

Figure 15:
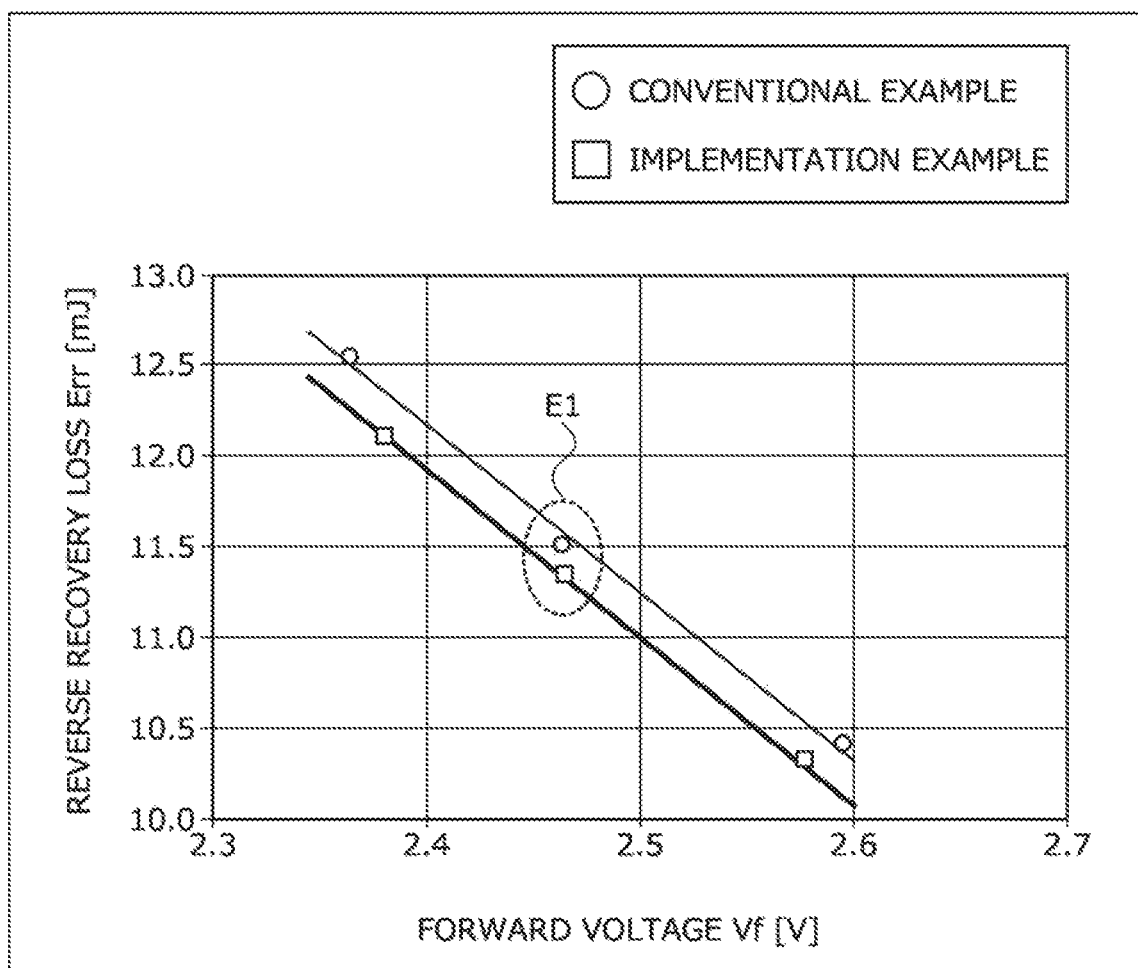
FIG. 15 is a characteristics diagram depicting a relationship of forward voltage and reverse recovery loss of the diode.
Figure 16:
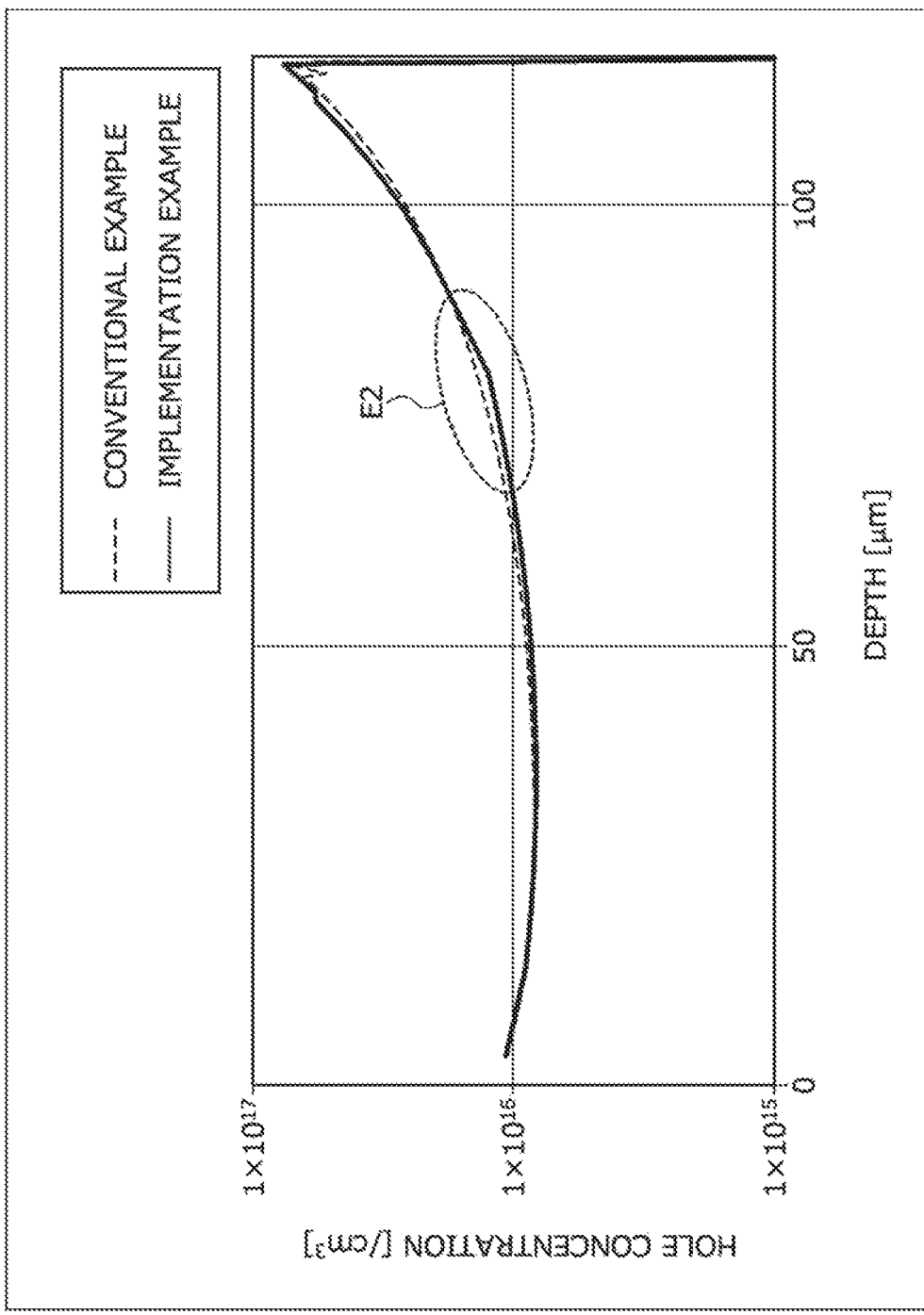
FIG. 16 is a characteristics diagram depicting hole density distribution at a time of forward bias of the diode.

For the described implementation example, the tradeoff relationship of reducing forward voltage Vf and reducing the reverse recovery loss Err was verified by simulation. FIG. 15 is a characteristics diagram depicting a relationship of forward voltage and reverse recovery loss of the diode. FIG. 16 is a characteristics diagram depicting hole density distribution at the time of forward bias of the diode. In FIG. 16, hole density distribution for forward voltage conditions surrounded by a circular frame E1 in FIG. 15 is depicted. In FIG. 16, a horizontal axis is the depth from the rear surface 10a of the semiconductor substrate 10 (depth=0 μm) in the depth direction, and a vertical axis is hole density in the semiconductor substrate 10.

From the results depicted in FIG. 15, the implementation example was confirmed to be capable of reducing the reverse recovery loss Err as compared to the conventional example for which the conditions of the forward voltage Vf were the same. Further, as depicted in FIG. 16, the implementation example was confirmed to have a lower hole density in the n−-type drift layer 1 (part of the bulk substrate (the semiconductor substrate 10) where the impurity concentration remains as is: part surrounded by a circular frame E2) during steady state forward bias than the conventional example. While not depicted, results were similar for other forward voltage conditions. In addition, from the results depicted in FIG. 16, the implementation example was confirmed to be capable of reducing the reverse recovery loss Err to a greater extent than the conventional example.

While not depicted, results for the semiconductor device according to the second and the third embodiments were similar to the implementation example.

Figure 18:
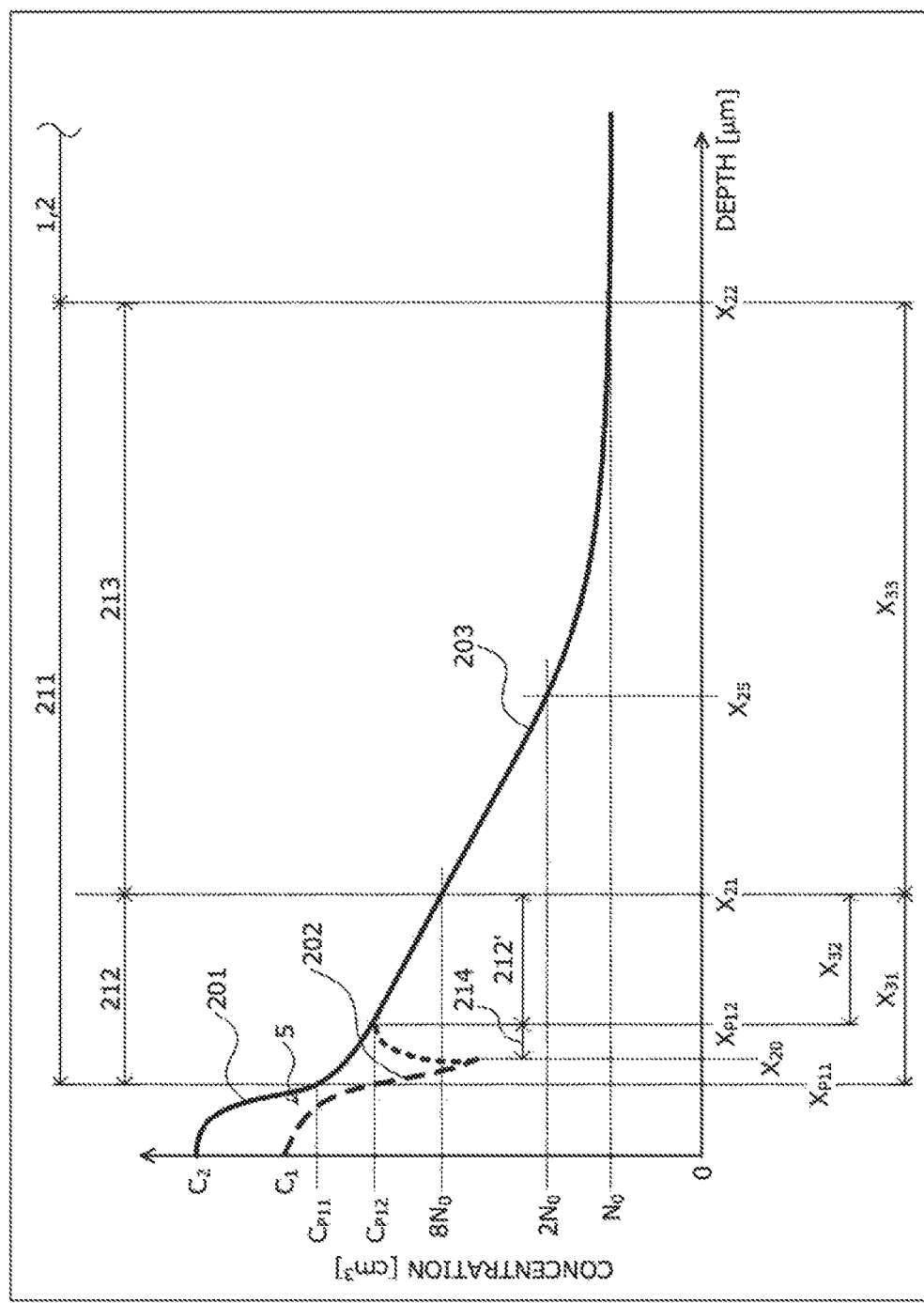
FIG. 18 is a characteristics diagram depicting net doping concentration distribution of the semiconductor device according to a fourth embodiment.

A structure of the semiconductor device according to a fourth embodiment will be described. FIG. 18 is a characteristics diagram depicting net doping concentration distribution of the semiconductor device according to the fourth embodiment. The semiconductor device according to the fourth embodiment differs from the semiconductor device according to the first embodiment in that in place of the plural n-type FS layers, a single n-type buffer layer 211 having a predetermined net doping concentration distribution 203 is selectively formed in the n−-type drift layer 1 by hydrogen donors from protons. The n-type buffer layer 211, similarly to the first embodiment, is a hydrogen donor layer.

The n-type buffer layer 211 has the net doping concentration distribution 203 that is constituted by an upper convex part 212 and a lower convex-shaped part 213. The upper convex part 212 of the net doping concentration distribution 203 of the n-type buffer layer 211 is a part where the net doping concentration of the n-type buffer layer 211 decreases in an upward convex shape or a substantially linear shape from the depth $X_{P1}$ where a peak value $C_{P11}$ occurs towards the anode side (toward the p-type anode layer 2). The depth $X_{P1}$ at which the net doping concentration of the n-type buffer layer 211 becomes the peak value $C_{P11}$ may be a position where a donor concentration (phosphorus, arsenic, etc.) other than of the hydrogen donors becomes substantially equal to the hydrogen donor concentration of the n-type buffer layer 211.

The lower convex-shaped part 213 of the net doping concentration distribution 203 of the n-type buffer layer 211 is a part thereof that is formed continuously with the upper convex part 212 on the anode side of the upper convex part 212, and where the net doping concentration curves in a convex shape (downward convex shape in FIG. 18) on the low concentration side and gradually decreases with increasing depth toward the anode side. A vertical axis indicating concentration is indicated by a logarithmic scale and a horizontal axis indicating depth is indicated by a linear scale. The unit of the vertical axis, for example, is (/cm$^3$).

The vertical axis is in a logarithmic scale, and when the net doping concentration distribution 203 of the n-type buffer layer 211 has a downward convex shape (distribution of the lower convex-shaped part 213), after a depletion layer spreading from the pn junction of the p-type anode layer 2 and the n−-type drift layer 1 reaches the n-type buffer layer 211, with respect to voltage increase, at first, the depletion layer very gradually ceases to expand, and the extent that expansion is suppressed further gradually increases with respect to voltage increase. In the logarithmic scale of the axis that indicates concentration, provided that the net doping concentration distribution 203 of the n-type buffer layer 211 has a downward convex shape, the extent of suppression of the depletion layer may be maintained extremely low. As a result, in the voltage waveform, a rate of change dV/dt may be sufficiently low, becoming a so-called soft waveform.

On the other hand, when the net doping concentration distribution 203 of the n-type buffer layer 211 changes to an upward convex shape (distribution of the upper convex part 212) in the logarithmic scale, expansion of the depletion layer from the pn junction of the p-type anode layer 2 and the n⁻-type drift layer 1 is rapidly suppressed. Therefore, when the depletion layer reaches the n-type buffer layer 211, the rate of change dV/dt of the voltage waveform rapidly increases, forming a so-called hard waveform. Therefore, in the net doping concentration distribution 203 of the n-type buffer layer 211, setting a distance $X_{31}$ over which the upper convex part 212 is distributed to be shorter than a distance $X_{33}$ over which the lower convex-shaped part 213 is distributed, is effective with respect to a soft suppression effect of the expansion of the depletion layer from the pn junction of the p-type anode layer 2 and the n⁻-type drift layer 1.

In the logarithmic scale, a position where the net doping concentration distribution 203 of the n-type buffer layer 211 changes from an upward convex shape to a downward convex shape, for example, is a position where the net doping concentration of the n-type buffer layer 211 is in a range from 7 times to 10 times a base doping concentration $N_0$ of the semiconductor substrate 10. The position where the net doping concentration distribution 203 of the n-type buffer layer 211 changes from an upward convex shape to a downward convex shape, in particular, may be a position corresponding to 8 times the base doping concentration (n⁻-type impurity concentration) $N_0$ of the semiconductor substrate 10 (bulk substrate), or this position may be set as a depth $X_{21}$ of a boundary of the upper convex part 212 and the lower convex-shaped part 213.

A depth $X_{25}$ at which the net doping concentration of the n-type buffer layer 211 becomes 2 times the base doping concentration $N_0$ of the semiconductor substrate 10 is a position where the hydrogen donor concentration (donor concentration of a hydrogen donor concentration distribution 223) constituting the n-type buffer layer 211 coincides with the base doping concentration $N_0$ of the semiconductor substrate 10 because the net doping concentration of the n-type buffer layer 211 is a sum of the hydrogen donor concentration and the base doping concentration $N_0$ of the semiconductor substrate 10. The lower convex-shaped part 213 of the net doping concentration distribution 203 of the n-type buffer layer 211 is a range from the depth $X_{21}$ at which the net doping concentration of the n-type buffer layer 211 becomes 8 times ($=8N_0$) the base doping concentration $N_0$ of the semiconductor substrate 10 to a depth $X_{22}$ substantially corresponding to the base doping concentration $N_0$ of the semiconductor substrate 10.

In FIG. 18, an impurity concentration distribution 201 in a part (a part corresponding to cutting line A1-A2 in a case of a structure in which the single n-type buffer layer 211 is provided in place of the plural n-type FS layers in FIG. 1) that passes through the n⁺-type cathode region 4 and the n-type buffer layer 211, from the rear surface 10a of the semiconductor substrate 10 in the depth direction is indicated by a solid line. Additionally, an impurity concentration distribution 202 in a part (a part corresponding to cutting line B1-B2 in a case of a structure in which the single n-type buffer layer 211 is provided in place of the plural n-type FS layers in FIG. 1) that passes through the p-type cathode region 5 and the n-type buffer layer 211, from the rear surface 10a of the semiconductor substrate 10 in the depth direction is indicated by a dashed line.

The impurity concentration distributions 201, 202 include in a part, the net doping concentration distribution 203 of the n-type buffer layer 211. Further, the impurity concentration distribution 202 is in contact with the impurity concentration distribution 201 (the upper convex part 212 of the net doping concentration distribution 203 of the n-type buffer layer 211), at a position (a depth $X_{P12}$) deeper from the rear surface 10a of the semiconductor substrate 10 than is a depth $X_{20}$ of a pn junction of the p-type cathode region 5 and the n-type buffer layer 211. An impurity concentration distribution of a part deeper on the anode side than is the depth $X_{P12}$ where both of the impurity concentration distributions 201, 202 merge is the same for both of the impurity concentration distributions 201, 202 and therefore, is indicated only by a solid line.

The peak value $C_{P11}$ of the net doping concentration of the n-type buffer layer 211 in the impurity concentration distribution 201 (i.e., a part where the rear surface 10a side of the semiconductor substrate 10 is the n⁺-type cathode region 4) is lower than the peak value $C_2$ of the impurity concentration of the n⁺-type cathode region 4. A peak value $C_{P12}$ of the net doping concentration of the n-type buffer layer 211 in the impurity concentration distribution 202 (i.e., a part where the rear surface 10a side of the semiconductor substrate 10 is the p-type cathode region 5) is lower than the peak value $C_1$ of the impurity concentration of the p-type cathode region 5 and is lower than the peak value $C_{P11}$ of the net doping concentration of the n-type buffer layer 211 in the impurity concentration distribution 201.

In the net doping concentration distribution 203 of the n-type buffer layer 211 of the impurity concentration distribution 201, the distance $X_{33}$ over which the lower convex-shaped part 213 is distributed may be longer than the distance $X_{31}$ over which the upper convex part 212 is distributed. In the impurity concentration distribution 201, the distance $X_{33}$ over which the lower convex-shaped part 213 is distributed is a distance from the depth $X_{21}$ of the boundary of the upper convex part 212 and the lower convex-shaped part 213 to the depth $X_{22}$ corresponding to the base doping concentration $N_0$ of the semiconductor substrate 10. The distance $X_{31}$ over which the upper convex part 212 is distributed is a distance from the depth $X_{P1}$ at which the net doping concentration of the n-type buffer layer 211 becomes the peak value $C_{P11}$ to the depth $X_{21}$ of the boundary of the upper convex part 212 and the lower convex-shaped part 213.

In the impurity concentration distribution 201, the depth $X_{P1}$ at which the net doping concentration of the n-type buffer layer 211 becomes the peak value $C_{P11}$ is an interface of the n⁺-type cathode region 4 and the n-type buffer layer 211 and is a depth position at which a magnitude relationship of concentrations of the n-type impurity of the n⁺-type cathode region 4 and the hydrogen donors of the n-type buffer layer 211 is inverted. In other words, with the depth $X_{P1}$ at which the net doping concentration of the n-type buffer layer 211 becomes the peak value $C_{P11}$ as a boundary, contribution to the impurity concentration distribution 201 of the n-type is the n-type impurity of the n⁺-type cathode region 4 being high toward the rear surface 10a of the semiconductor substrate 10 and the hydrogen donors of the n-type buffer layer 211 being high at a part deeper from the rear surface 10a of the semiconductor substrate 10 than is the depth $X_{P1}$ corresponding to the peak value $C_{P11}$.

In the net doping concentration distribution 203 of the n-type buffer layer 211 of the impurity concentration distribution 202, the distance $X_{33}$ over which the lower convex-shaped part 213 is distributed may be longer than a distance $X_{32}$ over which an upper convex part 212' is distributed. In the impurity concentration distribution 202, the distance $X_{33}$ of the lower convex-shaped part 213 is a distance from the depth $X_{21}$ of a boundary of the upper convex part 212' and the lower convex-shaped part 213 to the depth $X_{22}$ corresponding to the base doping concentration $N_0$ of the semiconductor substrate 10. The distance $X_{32}$ of the upper convex part 212' is a distance from the depth $X_{P12}$ at which the net doping concentration of the n-type buffer layer 211 becomes the peak value $C_{P12}$ to the depth $X_{21}$ of the boundary of the upper convex part 212' and the lower convex-shaped part 213.

In the impurity concentration distribution 202, the net doping concentration of the n-type buffer layer 211 increases in a mountain-like shape from the depth $X_{20}$ of the pn junction of the p-type cathode region 5 and the n-type buffer layer 211 toward the anode side and has a mountain-shaped part 214 indicative of the peak value. The net doping concentration of the n-type buffer layer 211 further has the upper convex part 212' that is continuous with the mountain-shaped part 214 on the anode side, and the lower convex-shaped part 213 that is continuous with the upper convex part 212' on the anode side. In the impurity concentration distribution 202, the depth $X_{P12}$ at which the net doping concentration of the n-type buffer layer 211 becomes the peak value $C_{P12}$ is a depth of the peak value of the mountain-shaped part 214 of the net doping concentration of the n-type buffer layer 211.

The fourth embodiment may be applied to the second and the third embodiments.

In the fourth embodiment, at the time of reverse recovery, the depletion layer that spreads from the pn junction between the p-type anode layer 2 and the n⁻-type drift layer 1 may be stopped slowly by a part where the net doping concentration distribution 203 of the n-type buffer layer 211 is the lower convex-shaped part 213, as compared to a case of an n-type buffer layer having a net doping concentration distribution without the lower convex-shaped part 213. An effect obtained by the n-type buffer layer 211, in particular, is useful when the fourth embodiment is applied to the third embodiment (i.e., the fourth embodiment is applied to a RC-IGBT).

In the RC-IGBT, at the time of reverse recovery of the FWD of the FWD region, the n⁺-type emitter region and an n⁻-type drift region (n⁻-type drift layer) of the IGBT of the IGBT region are shorted, and a parasitic npn bipolar transistor is assumed to operate using the n⁺-type emitter region as an emitter, a p-type base region as a base, and the n⁻-type drift region as a collector. At this time, by the n-type buffer layer 211, the donor concentration of the n⁻-type drift region may be maintained to be lower than the hole density of the p-type base region at a part where the net doping concentration distribution 203 becomes the lower convex-shaped part 213. As a result, a base spreading effect (Kirk effect: the n⁻-type drift region essentially becoming a base region) is suppressed, enabling suppression of movement of the critical field strength toward the rear surface 10a side of the semiconductor substrate 10.

Figure 19:
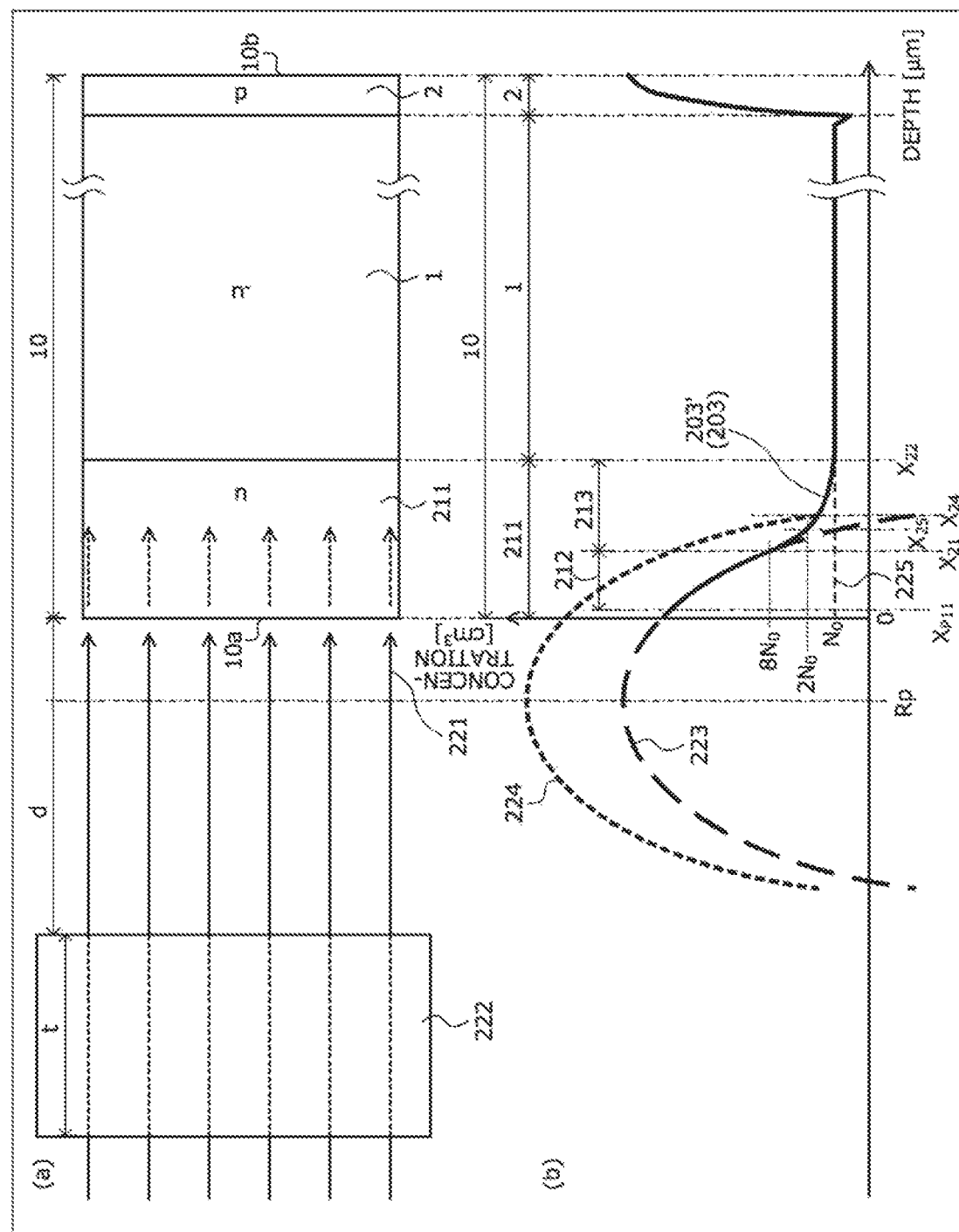
FIG. 19 is a diagram depicting a state of the semiconductor device according to the fourth embodiment during manufacture.

A method of manufacturing the semiconductor device according to the fourth embodiment will be described. FIG. 19 is a diagram depicting a state of the semiconductor device according to the fourth embodiment during manufacture. In FIG. 19, (a) is a schematic cross-sectional view of a state at the time of proton implantation 221 for forming the n-type buffer layer 211 depicted in FIG. 18 and (b) is a net doping concentration distribution 203' of hydrogen donors by the proton implantation 221. In FIG. 19, a horizontal axis corresponds to depth from the rear surface 10a of the semiconductor substrate 10 (depth=0 μm) in FIG. 18 (similarly in FIGS. 20(a) and 20(b)). In FIG. 19, the n⁺-type cathode region 4 and the p-type cathode region 5 (refer to FIG. 1) are not depicted.

First, similarly to the first embodiment, processes of preparing the semiconductor substrate 10 of an n⁻-type and forming the p-type anode layer 2, to grinding the rear surface 10a of the semiconductor substrate 10 are sequentially performed. Next, from the rear surface 10a of the ground semiconductor substrate 10, when the proton implantation 221 is performed for a single session by a single acceleration energy or for plural sessions (in plural stages) by differing acceleration energies, the single n-type buffer layer 211 is formed reaching the predetermined depth $X_{22}$ from the rear surface 10a of the semiconductor substrate 10.

The net doping concentration distribution 203' of the hydrogen donors by the proton implantation 221 depicted in (b) of FIG. 19 is the net doping concentration distribution of the n-type buffer layer 211 before formation of the n⁺-type cathode region 4 and the p-type cathode region 5. As described hereinafter, at a subsequent process, the n⁺-type cathode region 4 and the p-type cathode region 5 are formed in a surface layer of the n-type buffer layer 211, whereby the net doping concentration distribution of the n-type buffer layer 211 becomes the net doping concentration distribution 203 depicted in FIG. 18. A donor of the n⁺-type cathode region 4, for example, is phosphorus or arsenic, and an acceptor of the p-type cathode region 5, for example, is boron.

The proton implantation 221 that is performed for a single session or plural sessions is performed with respect to the rear surface 10a of the semiconductor substrate 10 overall, through an absorber 222 disposed on the rear surface 10a side of the semiconductor substrate 10, at a predetermined interval d from the semiconductor substrate 10. The range Rp of protons from the rear surface 10a of the semiconductor substrate 10 is adjusted by absorption of kinetic energy of the protons by the absorber 222 that set to have a predetermined thickness t. The absorber 222, for example, is a plate-like member made of aluminum, etc.

Further, the range Rp (i.e., depth position of the peak value of the net doping concentration distribution 203' of hydrogen donors by the proton implantation 221) of the protons from the rear surface 10a of the semiconductor substrate 10 is set to be closer to the absorber 222 (i.e., outside the semiconductor substrate 10) than is the rear surface 10a of the semiconductor substrate 10. Further, when the proton implantation 221 is performed for plural sessions, the proton implantation 221 is performed at respectively differing acceleration energies and the range Rp of the protons is set to be the same for all of the sessions of the proton implantation 221. The range Rp of the protons by the proton implantation 221 may be set to be at a position closer to the absorber 222 than is the surface layer at the rear surface 10a of the semiconductor substrate 10 (silicon substrate).

In particular, for example, the proton implantation 221 is assumed to be performed for 3 sessions through the absorber 222. In this case, the acceleration energies of 3 sessions of the proton implantation 221 are, for example, about 2 MeV or higher, and may be about 4 MeV, about 8 MeV, and about 16 MeV, respectively. The range Rp of the protons by the proton implantation 221 may be on the absorber 222 side from the rear surface 10a of the semiconductor substrate 10, at a position of a value in a range from 0.5 times a half width at half maximum to 3.0 times the half width at half maximum, which is determined by the acceleration energy. The half width at half maximum is a length in the concentration distribution of the protons implanted in the semiconductor substrate 10, from a position where the proton concentration peaks, to a position where the proton concentration becomes half the value of the peak, on the absorber 222 side in the depth direction or a side opposite the absorber 222 side.

For example, when the semiconductor substrate 10 is a silicon substrate and the acceleration energy of the protons is 2 MeV, the half width at half maximum is about 1 μm. Therefore, the range Rp of the protons by the proton implantation 221 may be in a range from about 0.5 μm to 3.0 μm from the rear surface 10a of the semiconductor substrate 10 toward the absorber 222. When acceleration energy of the protons is 4 MeV, the half width at half maximum is about 3 μm. Therefore, the range Rp of the protons by the proton implantation 221 may be in range from about 1.5 μm to 9.0 μm from the rear surface 10a of the semiconductor substrate 10 toward the absorber 222. When the acceleration energy of the protons is 8 MeV, the half width at half maximum is about 10 μm. Therefore, the range Rp of the protons by the proton implantation 221 may be in a range from about 5.0 μm to 30 μm from the rear surface 10a of the semiconductor substrate 10 toward the absorber 222. When the acceleration energy of the protons is 16 MeV, the half width at half maximum is about 30 μm. Therefore, the range Rp of the protons by the proton implantation 221 may be in a range from about 15 μm to 90 μm from the rear surface 10a of the semiconductor substrate 10 toward the absorber 222. Further, when the proton implantation 221 is performed for plural sessions, the range Rp of the protons by the proton implantation 221 may be a value on the absorber 222 side from the rear surface 10a of the semiconductor substrate 10, in a range from 0.5 times the half width at half maximum to 3.0 times the half width at half maximum of the lowest acceleration energy of the plural sessions of the proton implantation 221.

Further, even in cases where the semiconductor substrate is silicon carbide (SiC), gallium nitride (GaN), diamond, gallium oxide ($Ga_2O_3$), respectively, the range Rp of the protons by the proton implantation 221 may be on the absorber 222 side from the rear surface 10a of the semiconductor substrate 10, at a position of a value in a range from 0.5 times the half width at half maximum to 3.0 times the half width at half maximum, which is determined by the acceleration energy.

In this manner, the absorber 222 is set to the predetermined thickness t, whereby the range Rp of the protons in the proton implantation 221 is adjusted. The net doping concentration distributions of the $n^+$-type cathode region 4 and the p-type cathode region 5 overlap in the net doping concentration distribution 203' of the hydrogen donors by the proton implantation 221, forming the upper convex part 212 and the lower convex-shaped part 213 described above in the net doping concentration distribution 203 of the n-type buffer layer 211 (refer to FIG. 8).

In the net doping concentration distribution 203' of the hydrogen donors by the proton implantation 221, the net doping concentration at the rear surface 10a of the semiconductor substrate 10 (depth=0[μm]) may be 10% or less of the net doping concentration at the position of the range Rp (depth=−Rp[μm]) of the protons by the proton implantation 221.

In (b) of FIG. 19, a part of the hydrogen donor concentration distribution 223 and a part of a hydrogen chemical concentration distribution 224 depicted outside the semiconductor substrate 10 (a part at a depth less than 0 μm on the horizontal axis) is an imaginary line virtually depicting Gaussian distribution that represents spreading of the protons from the range Rp of the protons, outside the semiconductor substrate 10 so that the position of the range Rp of the protons of the proton implantation 221 is clear.

In other words, the part of the hydrogen donor concentration distribution 223 and the part of the hydrogen chemical concentration distribution 224 depicted outside the semiconductor substrate 10 in (b) of FIG. 19 are parts where the proton implantation 221 is not actually performed in the semiconductor substrate 10 because the energy of the proton implantation 221 is absorbed by the absorber 222. Therefore, in (b) of FIG. 19, in a part where the depth along the horizontal axis is less than 0 μm, members, substances, impurity concentration distributions do not exist.

A region (i.e., a region from the rear surface 10a of the semiconductor substrate 10 to the depth $X_{22}$ where the hydrogen donor concentration coincides with the base doping concentration $N_0$ of the semiconductor substrate 10) where the hydrogen donor concentration is at least equal to the base doping concentration $N_0$ of the semiconductor substrate 10 is a region in which hydrogen donors are net-doped by the proton implantation 221. In this region, the hydrogen donor concentration at a depth where the hydrogen donor concentration is lower than the net doping concentration of the $n^+$-type cathode region 4 and the p-type cathode region 5, for example, is calculated as follows.

In the region where the hydrogen donor concentration is at least the base doping concentration $N_0$ of the semiconductor substrate 10, the hydrogen donor concentration is divided by the hydrogen chemical concentration and a donor rate of the hydrogen donors is calculated in advance (the donor rate of the hydrogen donors=the hydrogen donor concentration/the hydrogen chemical concentration). While the donor rate may be dependent on depth, the donor rate may be an average value thereof. In (b) of FIG. 19, the hydrogen donor concentration distribution, the hydrogen chemical concentration distribution, and a base doping concentration distribution of the semiconductor substrate 10 are depicted by dashed lines assigned reference numerals 223 to 225, respectively (similarly in FIGS. 20 and 22).

The hydrogen chemical concentration at a depth where the net doping concentration of the n-type buffer layer 211 is lower than the net doping concentration of an n-type impurity of the $n^+$-type cathode region 4 and the net doping concentration of a p-type impurity of the p-type cathode region 5 is multiplied with the donor rate of the hydrogen donors. As a result, the hydrogen donor concentration at a depth where the net doping concentration of the n-type buffer layer 211 is lower than the net doping concentration of the $n^+$-type cathode region 4 and the net doping concentration of the p-type cathode region 5 may be easily calculated.

The hydrogen chemical concentration is the concentration of protons (hydrogen (including non-donor hydrogen)) introduced in the semiconductor substrate 10 by the proton implantation 221. The hydrogen chemical concentration in the semiconductor substrate 10, for example, may be measured by secondary ion mass spectrometry (SIMS).

The hydrogen donor concentration is the concentration of donor-converted hydrogen (hydrogen donors) only of the protons (hydrogen) introduced in the semiconductor substrate 10. The hydrogen donor concentration in the semiconductor substrate 10 may be measured by spreading resistance (SR) measurement, capacitance-voltage (CV) measurement and deep level transient spectroscopy (DLTS) measurement.

In SR measurement, when carrier mobility of the semiconductor substrate 10 after the proton implantation 221 is lower than the carrier mobility of the semiconductor substrate 10 before the proton implantation 221, the hydrogen donor concentration becomes lower compared to the CV measurement. The hydrogen donor concentration at the position where the range Rp of the protons of the proton implantation 221, for example, may be calculated based on the acceleration energy and dose amount of the protons by the proton implantation 221, by assuming the hydrogen donor concentration distribution 223 to have Gaussian distribution.

Next, similarly to the first embodiment, after the p-type cathode region 5 and the n$^+$-type cathode region 4 are formed, an annealing process for activation is performed. A temperature of the annealing process for activation, for example, is about 330 degrees C. or higher and may be 350 degrees C. or higher, and further may be 380 degrees C. or higher. A reason for this is that protons diffuse into the semiconductor substrate 10, further facilitating formation of the lower convex-shaped part 213 of the net doping concentration distribution 203 of the n-type buffer layer 211. Similarly to the first embodiment, after the p-type cathode region 5 and the n$^+$-type cathode region 4 are formed, the annealing process for activation may be performed before the proton implantation and an activation annealing process for the implanted protons.

Instead of collectively activating the n-type buffer layer 211, the p-type cathode region 5 and the n$^+$-type cathode region 4, an annealing process for activation may be performed upon the formation of each of the n-type buffer layer 211, the p-type cathode region 5 and the n$^+$-type cathode region 4. Thereafter, similarly to the first embodiment, the process of forming the anode electrode 3 or the cathode electrode 8 and subsequent processes are performed, whereby the diode that includes the n-type buffer layer 211 having the net doping concentration distribution 203 depicted in FIG. 18 is completed.

Figure 20:
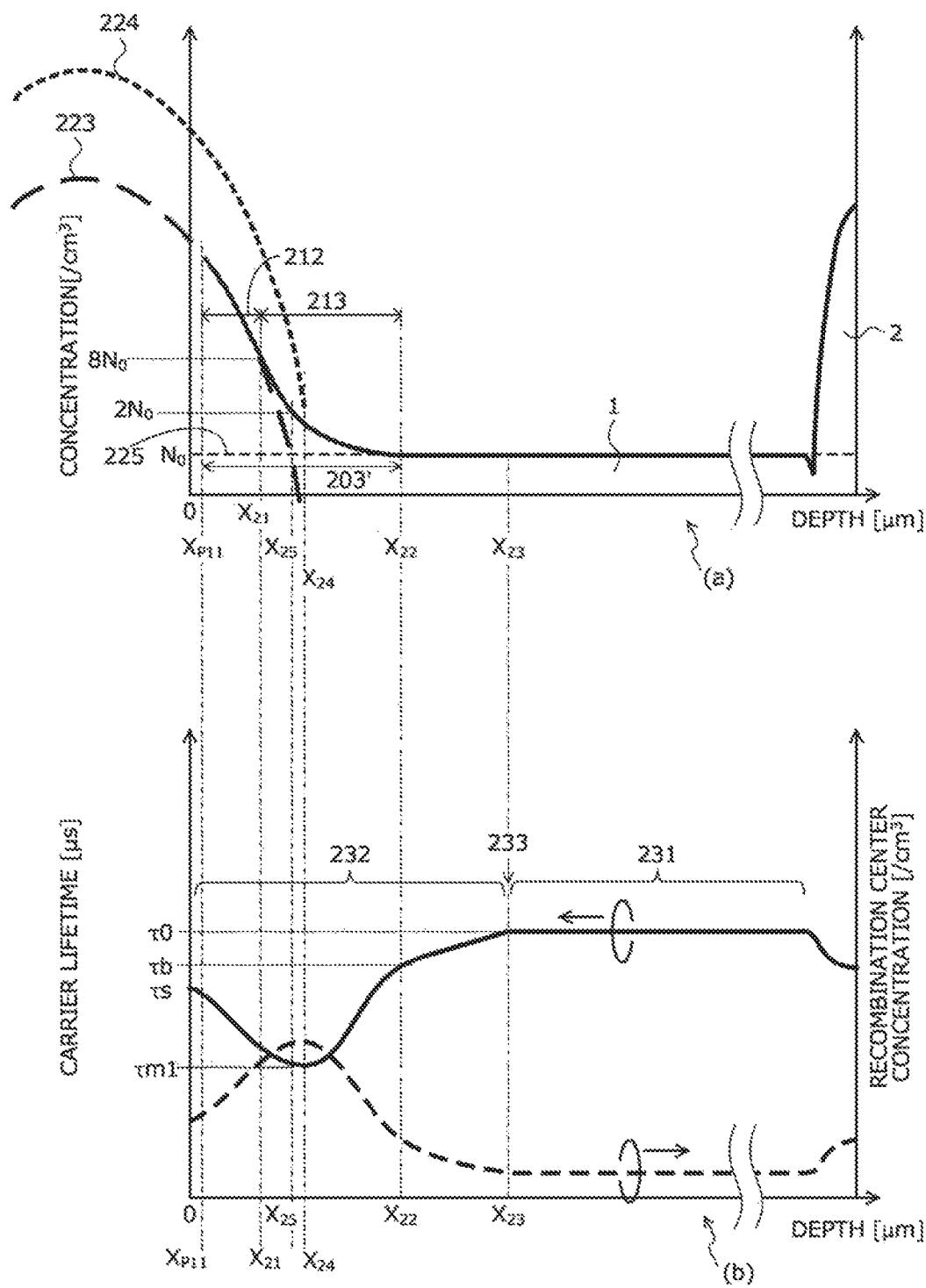
FIG. 20 is a characteristics diagram depicting relationships of carrier lifetime distribution and recombination center concentration distribution with respect to the net doping concentration distribution depicted in FIG. 18.

A relationship of the net doping concentration distribution 203' of hydrogen donors by the proton implantation 221, carrier lifetime, and recombination center concentration will be described. FIG. 20 is a characteristics diagram depicting relationships of carrier lifetime distribution and recombination center concentration distribution with respect to the net doping concentration distribution depicted in FIG. 18. FIG. 20(a) depicts the net doping concentration distribution 203' of hydrogen donors by the proton implantation 221 depicted at (b) of FIG. 19. FIG. 20(b) depicts the carrier lifetime distribution and the recombination center concentration distribution corresponding to the net doping concentration distribution 203' depicted in FIG. 20(a). FIGS. 20(a) and 20(b) do not depict the n$^+$-type cathode region 4 or the p-type cathode region 5 (refer to FIG. 1).

As depicted in FIG. 20(b), in the semiconductor substrate 10, a depth $X_{23}$ of a boundary 233 of a first region 231 having a carrier lifetime (hereinafter, bulk carrier lifetime) TO of the semiconductor substrate 10 as is and a second region 232 that is closer toward the rear surface 10a of the semiconductor substrate 10 than is the first region 231 and that has a carrier lifetime shorter than the bulk carrier lifetime TO may be positioned closer to the front surface 10b of the semiconductor substrate 10 than is the depth $X_{22}$ at which the net doping concentration of the lower convex-shaped part 213 of the net doping concentration distribution 203 (the net doping concentration distribution 203' of the hydrogen donors) of the n-type buffer layer 211 coincides with the base doping concentration $N_0$ of the semiconductor substrate 10. In positioning the boundary 233 at the depth $X_{23}$, in the semiconductor substrate 10, recombination centers are distributed from the rear surface 10a of the semiconductor substrate 10 to a position (the depth $X_{23}$) deeper toward the front surface 10b of the semiconductor substrate 10 is than a depth $X_{24}$ at which a hydrogen chemical concentration distribution (distribution of hydrogen atoms) 224 coincides with the base doping concentration $N_0$ of the semiconductor substrate 10.

The position of the depth $X_{24}$ at which the hydrogen chemical concentration distribution 224 coincides with the base doping concentration $N_0$ of the semiconductor substrate 10 is be positioned to be closer to the front surface 10b of the semiconductor substrate 10 than is the depth $X_{21}$ of a boundary the lower convex-shaped part 213 and the upper convex part 212, 212' of the net doping concentration distribution 203 of the n-type buffer layer 211. Further, the position of the depth $X_{24}$ at which the hydrogen chemical concentration distribution 224 coincides with the base doping concentration $N_0$ of the semiconductor substrate 10 may be positioned to be closer to the front surface 10b of the semiconductor substrate 10 than is a depth $X_{25}$ where the net doping concentration of the n-type buffer layer 211 becomes 2 times the base doping concentration $N_0$ of the semiconductor substrate.

In distributing recombination centers from the rear surface 10a of the semiconductor substrate 10 to a position deeper toward the front surface 10b of the semiconductor substrate 10 than is the depth $X_{24}$ at which the hydrogen chemical concentration distribution 224 coincides with the base doping concentration $N_0$ of the semiconductor substrate 10, the acceleration energy is set to be excessively high in the proton implantation 221 for forming the n-type buffer layer 211, whereby excessive kinetic energy is given to the protons, the excessive kinetic energy given to the protons is absorbed by the absorber 222 as described above, and thereafter, the protons are implanted in the semiconductor substrate 10. Setting the acceleration energy to be excessively high, that is, when absorbing the kinetic energy using the absorber, the acceleration energy may be set high to an extent that the range Rp of the protons becomes further deeper than the predetermined depth of the semiconductor substrate 10, or to an extent that the protons penetrate through the semiconductor substrate 10.

In this manner, the proton implantation 221 is performed, whereby large implantation damage may be caused to the semiconductor substrate 10 by the proton implantation 221, thereby forming a large amount of recombination centers by point defects and dislocations, interstitial atoms and further due to the disorder for which the degree of these is strong. As a result, recombination centers may be distributed from the rear surface 10a of the semiconductor substrate 10 to a position (the depth $X_{23}$) deeper toward the front surface 10b of the semiconductor substrate 10 than is the depth $X_{24}$ at which the hydrogen chemical concentration distribution 224 coincides with the base doping concentration $N_0$ of the semiconductor substrate 10. Further, by distributing the recombination centers from the rear surface 10a of the semiconductor substrate 10 to a position (the depth $X_{23}$)

deeper toward the front surface 10b of the semiconductor substrate 10 than is the depth $X_{24}$ at which the hydrogen chemical concentration distribution 224 coincides with the base doping concentration $N_0$ of the semiconductor substrate 10, a lifetime τb at the depth $X_{22}$ where the net doping concentration of the n-type buffer layer 211 coincides with the base doping concentration $N_0$ of the semiconductor substrate 10 may be made lower than the bulk carrier lifetime τ0.

In the first region 231, the recombination centers are not formed. Therefore, a carrier lifetime of the first region 231 is the bulk carrier lifetime τ0. In this manner, recombination centers are distributed in the semiconductor substrate 10, whereby a carrier lifetime of the n-type buffer layer 211 becomes equal to the bulk carrier lifetime τ0, or shorter than the carrier lifetime (not depicted) that is longest in the semiconductor substrate 10. As a result, a tradeoff relationship of reducing the ON voltage and reducing turn OFF loss of the IGBT may be improved. Further, current (tail current) that transiently flows due to reverse recovery characteristics for storing minority carriers at the time of turn ON of the diode may be reduced, enabling switching loss to be reduced.

The carrier lifetime in the semiconductor substrate 10, for example, becomes a shortest value τm1 at the depth $X_{24}$ at which from the rear surface 10a of the semiconductor substrate 10, the hydrogen chemical concentration distribution 224 coincides with the base doping concentration $N_0$ of the semiconductor substrate 10. The shortest carrier lifetime τm1 in the semiconductor substrate 10 may be shorter than a carrier lifetime TS near the rear surface 10a of the semiconductor substrate 10. The shortest carrier lifetime τm1 may be set to shorter than the carrier lifetime TS near the rear surface 10a of the semiconductor substrate 10. A reason for this is as follows.

In the semiconductor substrate 10, by the proton implantation 221, the hydrogen chemical concentration is highest near the rear surface 10a of the semiconductor substrate 10 and hydrogen atoms are introduced having the hydrogen chemical concentration distribution 224 in which the hydrogen chemical concentration decreases with increasing distance from the rear surface 10a of the semiconductor substrate 10. The hydrogen atoms of the semiconductor substrate 10 terminate dangling bonds of point defects. Therefore, compared to a region near the depth $X_{P11}$ where the net doping concentration of the n-type buffer layer 211 becomes the peak value $C_{P11}$, the dangling bonds of many point defects near the rear surface 10a of the semiconductor substrate 10 are terminated by hydrogen atoms. As a result, the recombination center concentration near the rear surface 10a of the semiconductor substrate 10 becomes lower than the recombination center concentration at the depth $X_{P11}$ where the net doping concentration of the n-type buffer layer 211 becomes the peak value $C_{P11}$.

A carrier lifetime τb at the depth $X_{22}$ where the net doping concentration of the n-type buffer layer 211 coincides with the base doping concentration $N_0$ of the semiconductor substrate 10 may be longer that the carrier lifetime TS near the rear surface 10a of the semiconductor substrate 10.

Figure 21:
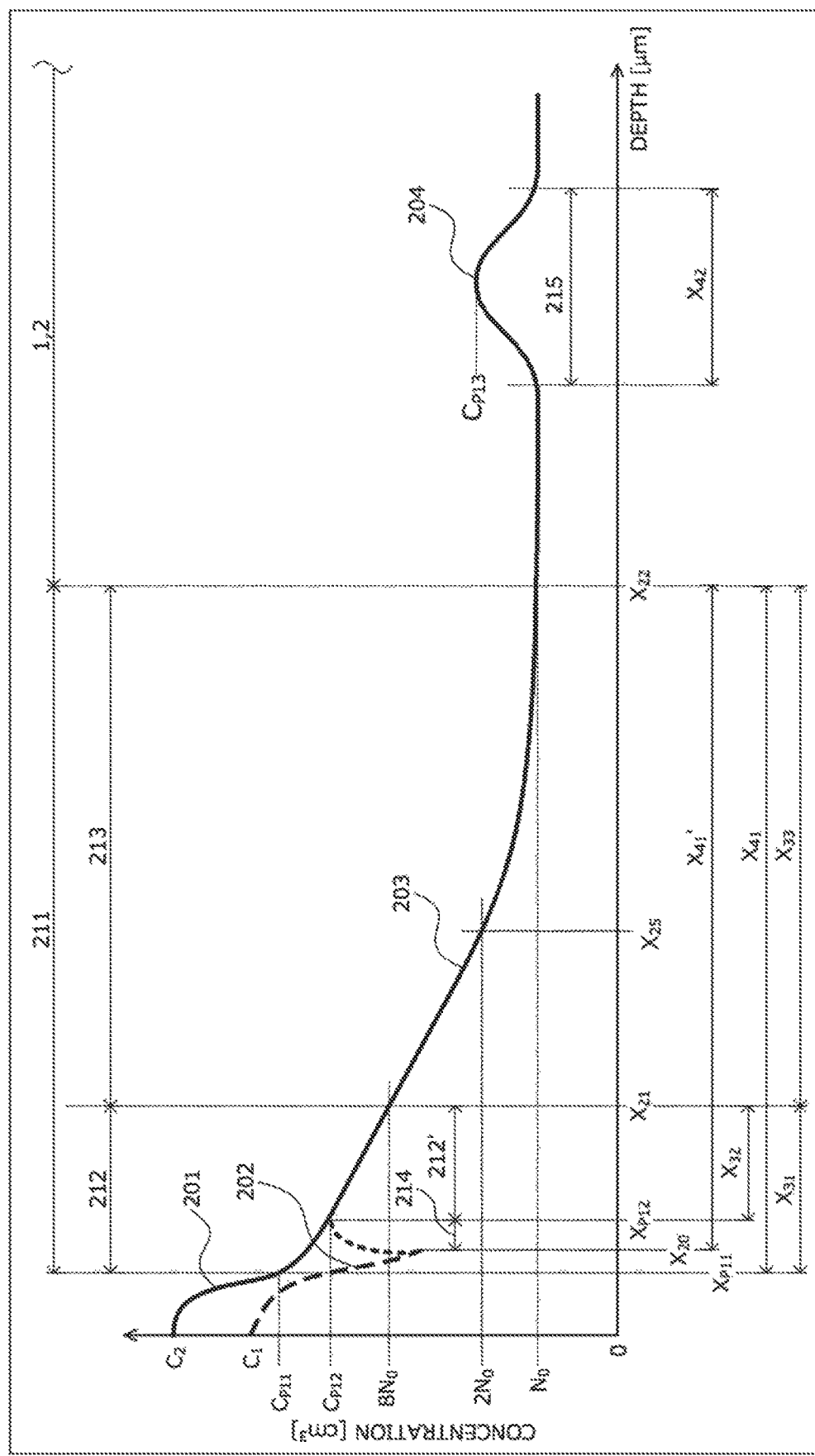
FIG. 21 is a characteristics diagram depicting another example of the semiconductor device according to the fourth embodiment.

FIG. 21 is a characteristics diagram depicting another example of the semiconductor device according to the fourth embodiment. This other example of the semiconductor device according to the fourth embodiment depicted in FIG. 21 differs from the semiconductor device according to the fourth embodiment depicted in FIG. 18 in that in the n⁻-type drift layer 1, at a part deeper from the rear surface 10a of the semiconductor substrate 10 than is the n-type buffer layer 211, one or more of an n-type FS layer 215 is selectively provided separated from the n-type buffer layer 211, by proton implantation. In FIG. 21, a case is depicted in which one n-type FS layer 215 is included.

A thickness $X_{42}$ of the n-type FS layer 215 may be thicker than the thickness $X_{41}$ of the n-type buffer layer 211 of a part where the rear surface 10a side of the semiconductor substrate 10 is the n⁺-type cathode region 4. In this case, of the plural sessions of the proton implantation 221 (refer to (a) in FIG. 19), the acceleration energy of the proton implantation 221 for forming the n-type FS layer 215 is set to be higher than the acceleration energy of the proton implantation 221 for forming the n-type buffer layer 211.

Alternatively, the thickness $X_{42}$ of the n-type FS layer 215 may be made thinner than a thickness $X_{41}'$ of the n-type buffer layer 211 of a part where the rear surface 10a side of the semiconductor substrate 10 is the p-type cathode region 5. In this case, the proton implantation for forming the n-type FS layer 215 uses lower acceleration energy than that of the proton implantation 221 for forming the n-type buffer layer 211 and is performed without using the absorber 222.

The thickness $X_{41}'$ of the n-type buffer layer 211 of the part where the rear surface 10a side of the semiconductor substrate 10 is the p-type cathode region 5 is thinner than the thickness $X_{41}$ of the n-type buffer layer 211 of the part where the rear surface 10a side of the semiconductor substrate 10 is the n⁺-type cathode region 4. A peak value $C_{P13}$ of an impurity concentration of the n-type FS layer 215 may be lower than the peak values $C_{P11}$, $C_{P12}$ of the net doping concentration of the n-type buffer layer 211.

The n-type FS layer 215, similarly to the first embodiment, is a hydrogen donor layer. When two or more of the n-type FS layers 215 are provided, similarly to the n-type FS layer of the first embodiment, the two or more n-type FS layers 215 are disposed at differing depths from the rear surface 10a of the semiconductor substrate 10 and oppose each other in the depth direction.

In this manner, at a part deeper from the rear surface 10a of the semiconductor substrate 10 than is the n-type buffer layer 211, one or more of the n-type FS layers 215 is provided by proton implantation, whereby breakdown voltage capability may be improved during a period in which due to surge voltage, the IGBT self-clamps, turns OFF and an avalanche state continues. Further, oscillation of voltage/current waveforms of the diode at the time of reverse recovery may be suppressed.

Figure 22:
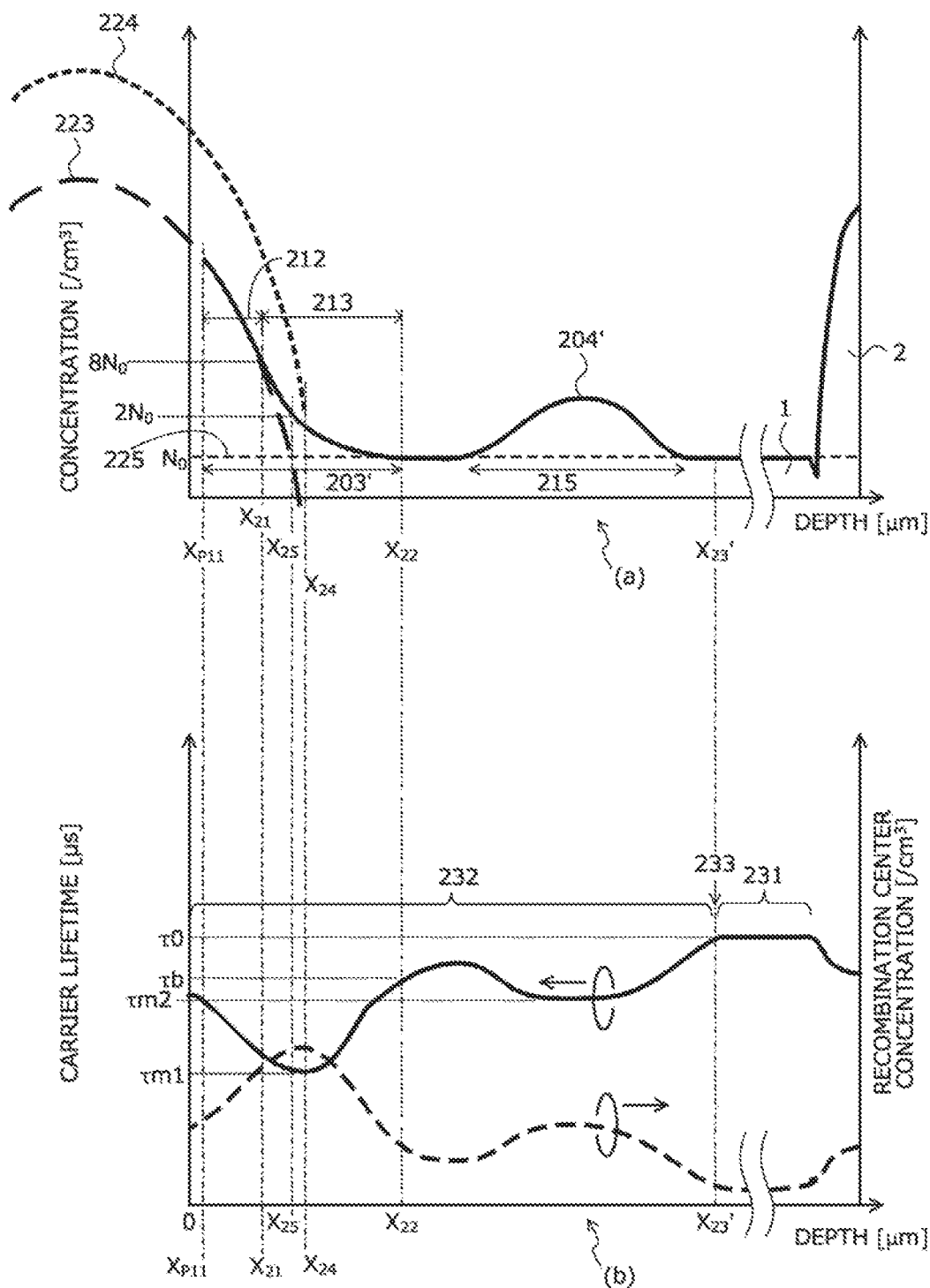
FIG. 22 is a characteristics diagram depicting a relationship of recombination center concentration distribution and carrier lifetime distribution with respect to the net doping concentration distribution of FIG. 21.

In another example of the semiconductor device according to the fourth embodiment depicted in FIG. 21, a relationship of the net doping concentration distributions 203', 204' of hydrogen donors by proton implantation for forming the n-type buffer layer 211 and the n-type FS layer 215 depicted in FIG. 21, with carrier lifetime and recombination center concentration are described. FIG. 22 is a characteristics diagram depicting a relationship of recombination center concentration distribution and carrier lifetime distribution with respect to the net doping concentration distribution of FIG. 21.

In FIG. 22(a), the net doping concentration distributions 203', 204' of hydrogen donors by the proton implantation for forming the n-type buffer layer 211 and the n-type FS layer 215 in FIG. 21 are depicted. In FIG. 22(b), the carrier lifetime distribution and the recombination center concentration distribution corresponding to the net doping concentration distribution 203', 204' in FIG. 22(a) are depicted. In FIGS. 22(a) and 22(b), a horizontal axis corresponds to the depth from the rear surface 10a of the semiconductor substrate 10 (depth=0 μm) in FIG. 21.

The recombination center concentration distribution of the other example of the semiconductor device according to the fourth embodiment depicted in FIG. 21 differs from the recombination center concentration distribution of the semiconductor device according to the fourth embodiment depicted in FIG. 18 in that the recombination center concentration near the n-type FS layer 215 is high. This recombination center concentration distribution may be realized by forming the n-type FS layer 215 by the proton implantation 221 using the absorber 222 similarly to the n-type buffer layer 211. Provision of the n-type FS layer 215, enables a depth $X_{23}'$ of the boundary 233 of the first region 231 and the second region 232 to be made closer to the front surface 10$b$ of the semiconductor substrate 10 as compared to a case where the n-type FS layer 215 is not provided.

Further, the hydrogen chemical concentration near the n-type FS layer 215 is lower than the hydrogen chemical concentration near the n-type buffer layer 211. Therefore, near the n-type FS layer 215, dangling bonds of point defects are not sufficiently terminated by hydrogen atoms as compared to near the n-type buffer layer 211. Therefore, the recombination center concentration near the n-type FS layer 215 becomes higher than the recombination center concentration at the depth $X_{22}$ at which the net doping concentration of the n-type buffer layer 211 coincides with the base doping concentration $N_0$ of the semiconductor substrate 10. As a result, a carrier lifetime τm2 near the n-type FS layer 215 may be shorter than the carrier lifetime τb at the depth $X_{22}$ at which the net doping concentration of the n-type buffer layer 211 coincides with the base doping concentration $N_0$ of the semiconductor substrate 10.

As described above, according to the fourth embodiment, even when one n-type buffer layer formed by hydrogen donors from protons is provided in place of the plural n-type FS layers, effects similar to those of the first to the third embodiments may be obtained.

The present invention is not limited to the embodiments herein and various modifications within a range not departing from the spirit of the invention are possible. For example, in the embodiments above, while a case where four n-type FS layers are disposed is described as an example, the number of the n-type FS layers may be variously changed according to design conditions. Further, the electrodes have a single layer structure constituted by a single metal film, or may have a stacked structure in which plural metal films are stacked. Further, the present invention is similarly implemented when conductivity types (n-type, p-type) are inverted.

According to the described embodiments of the present invention, at the time of reverse recovery, holes are injected to the third semiconductor region from the second electrode, increasing the hole density on the third semiconductor layer side. As a result, electric field on the third semiconductor layer side is mitigated and oscillation of voltage/current waveforms during reverse recovery is suppressed, enabling reverse recovery loss to be reduced. Further, according to the embodiments, during steady state forward bias, the hole density near a depth of a center of the first semiconductor layer decreases and the hole density on the third semiconductor layer side proportionately increases. Therefore, the forward voltage may be prevented from increasing.

According to the semiconductor device of the present invention, an effect is achieved in that in a diode, a tradeoff relationship of forward voltage reduction and reverse recovery loss reduction may be improved and soft recovery may be realized.

As described, the semiconductor device according to the present invention is useful for semiconductor devices used in power converting equipment such as inverters and in automotive igniters.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a first semiconductor layer of a first conductivity type and having a first main surface and a second main surface;
   a second semiconductor layer of a second conductivity type provided on the first main surface of the first semiconductor layer;
   a third semiconductor layer provided on the second main surface of the first semiconductor layer;
   a plurality of first semiconductor regions of the first conductivity type and provided at differing depths in a depth direction in the first semiconductor layer, the plurality of first semiconductor regions having an impurity concentration higher than that of the first semiconductor layer;
   a second semiconductor region of the first conductivity type, constituting a part of the third semiconductor layer in contact with a first semiconductor region that of the plurality of first semiconductor regions is nearest the third semiconductor layer, the second semiconductor region having an impurity concentration that is higher than that of the plurality of first semiconductor regions;
   a third semiconductor region of the second conductivity type and constituting a part of the third semiconductor layer in contact with the first semiconductor region, the third semiconductor region being in contact with the second semiconductor region along a direction parallel to the second main surface;
   a first electrode in contact with the second semiconductor layer; and
   a second electrode in contact with the second semiconductor region and the third semiconductor region, wherein
   a first maximum value of the impurity concentration of the plurality of first semiconductor regions is lower than a second maximum value of the impurity concentration of the second semiconductor region and a third maximum value of an impurity concentration of the third semiconductor region, the first maximum value being a peak, the plurality of first semiconductor regions having an impurity concentration distribution that decreases from the peak toward the second semiconductor layer and toward the third semiconductor layer,
   the impurity concentration of the third semiconductor region at an interface with the first semiconductor region is lower than the impurity concentration of the second semiconductor region at an interface with the first semiconductor region, and
   peak concentrations of the impurity concentration at a part of the first semiconductor region opposing the second semiconductor region in the depth direction and at a part of the first semiconductor region opposing the third semiconductor region are equal.

2. The semiconductor device according to claim 1, wherein the third maximum value of the impurity concentration of the third semiconductor region is lower than the second maximum value of the impurity concentration of the second semiconductor region.

3. The semiconductor device according to claim 1, wherein
the third maximum value of the impurity concentration of the third semiconductor region is higher than the peak of the impurity concentration of the first semiconductor region of the plurality of first semiconductor regions.

4. The semiconductor device according to claim 1, wherein
the third maximum value of the impurity concentration of the third semiconductor region is higher than a lowest value of the impurity concentration of the second semiconductor region at an interface of the second semiconductor region and the first semiconductor region of the plurality of first semiconductor regions.

5. The semiconductor device according to claim 1, wherein
a part among parts of the first semiconductor region closer toward the third semiconductor layer than is the peak has an impurity concentration that is 0.5 times the first maximum value or less reaches a predetermined depth from an interface of the third semiconductor region and the first semiconductor region, and
a distance from the predetermined depth to the interface of the third semiconductor region and the first semiconductor region is longer than a thickness of the third semiconductor region.

6. The semiconductor device according to claim 5, wherein
the distance from the predetermined depth to the interface of the third semiconductor region and the first semiconductor region is at least two times the thickness of the third semiconductor region.

7. The semiconductor device according to claim 6, wherein
the distance from the predetermined depth to the interface of the third semiconductor region and the first semiconductor region is at least the thickness of the third semiconductor region and 10 μm at most.

8. The semiconductor device according to claim 1, wherein
a thickness of the third semiconductor region is thinner than a thickness of the second semiconductor region.

9. The semiconductor device according to claim 1, wherein
crystal defects are introduced between the third semiconductor layer and the peak of the first semiconductor region.

10. The semiconductor device according to claim 1 and further comprising:
a fourth semiconductor layer of the second conductivity type provided on the first main surface of the first semiconductor layer and electrically connected with the first electrode;
a fourth semiconductor region of the first conductivity type electively provided in the fourth semiconductor layer and electrically connected with the first electrode;
a gate insulating film in contact with a region of the fourth semiconductor layer between the fourth semiconductor region and the first semiconductor layer;
a gate electrode provided opposing the fourth semiconductor layer, across the gate insulating film; and
a fifth semiconductor region of the second conductivity type selectively provided in the second main surface of the first semiconductor layer to be in contact with the second electrode, the fifth semiconductor region being in contact with the second semiconductor region along a direction parallel to the second main surface.

11. The semiconductor device according to claim 10, wherein
crystal defects are introduced near a boundary of the first semiconductor layer with the second semiconductor layer.

12. The semiconductor device according to claim 1, wherein
the first semiconductor region is a hydrogen donor layer.

13. The semiconductor device according to claim 1, wherein
another first semiconductor region among the plurality of first semiconductor regions has a peak impurity concentration value less than the peak impurity concentration value of the first semiconductor region, the peak impurity concentration value of the another first semiconductor region being greater than an impurity concentration value at a position between the first semiconductor region and the another first semiconductor region.

14. The semiconductor device according to claim 1, further comprising:
another second semiconductor region of the first conductivity type, constituting a part of the third semiconductor layer in contact with the first semiconductor region that of the plurality of first semiconductor regions is nearest the third semiconductor layer, the another second semiconductor region having an impurity concentration that is higher than that of the plurality of first semiconductor regions, and being in contact with the third semiconductor region along the direction parallel to the second main surface on a side of the third semiconductor region which is opposite to a side of the third semiconductor region in contact with the second semiconductor region.

15. The semiconductor device according to claim 1, wherein an impurity concentration slope from the peak position of the impurity concentration of the first semiconductor region in a direction toward the third semiconductor layer is less than an impurity concentration slope from the peak position of the impurity concentration of the first semiconductor region in a direction toward the second semiconductor layer.

16. A semiconductor device, comprising:
a first semiconductor layer of a first conductivity type and having a first main surface and a second main surface;
a second semiconductor layer of a second conductivity type provided on the first main surface of the first semiconductor layer;
a third semiconductor layer provided on the second main surface of the first semiconductor layer;
a plurality of first semiconductor regions of the first conductivity type and provided at differing depths in the first semiconductor layer, the plurality of first semiconductor regions having an impurity concentration higher than that of the first semiconductor layer;
a second semiconductor region of the first conductivity type, constituting a part of the third semiconductor layer in contact with a first semiconductor region that of the plurality of first semiconductor regions is nearest the third semiconductor layer, the second semiconductor region having an impurity concentration that is higher than that of the plurality of first semiconductor regions;

a third semiconductor region of the second conductivity type and constituting a part of the third semiconductor layer in contact with the first semiconductor region, the third semiconductor region being in contact with the second semiconductor region along a direction parallel to the second main surface;

a first electrode in contact with the second semiconductor layer; and a second electrode in contact with the second semiconductor region and the third semiconductor region, wherein a first maximum value of the impurity concentration of the plurality of first semiconductor regions is lower than a second maximum value of the impurity concentration of the second semiconductor region and a third maximum value of an impurity concentration of the third semiconductor region, the first maximum value being a peak, the plurality of first semiconductor regions having an impurity concentration distribution that decreases from the peak toward the second semiconductor layer and toward the third semiconductor layer, the impurity concentration of the third semiconductor region at an interface with the first semiconductor region is lower than the impurity concentration of the second semiconductor region at an interface with the first semiconductor region, a part among parts of the first semiconductor region closer toward the third semiconductor layer than is the peak has an impurity concentration that is 0.5 times the first maximum value or less reaches a predetermined depth from an interface of the third semiconductor region and the first semiconductor region, and a distance from the predetermined depth to the interface of the third semiconductor region and the first semiconductor region is longer than a thickness of the third semiconductor region.

17. The semiconductor device according to claim 16, wherein the distance from the predetermined depth to the interface of the third semiconductor region and the first semiconductor region is at least two times the thickness of the third semiconductor region.

18. The semiconductor device according to claim 17, wherein the distance from the predetermined depth to the interface of the third semiconductor region and the first semiconductor region is at least the thickness of the third semiconductor region and 10 μm at most.

* * * * *